United States Patent [19]

Uchida

[11] Patent Number: 5,822,255
[45] Date of Patent: Oct. 13, 1998

[54] SEMICONDUCTOR INTEGRATED CIRCUIT FOR SUPPLYING A CONTROL SIGNAL TO A PLURALITY OF OBJECT CIRCUITS

[75] Inventor: Toshiya Uchida, Kawasaki, Japan

[73] Assignee: Fujitsu Limited, Kawasaki, Japan

[21] Appl. No.: 790,794

[22] Filed: Jan. 30, 1997

[30] Foreign Application Priority Data

Aug. 13, 1996 [JP] Japan .................................. 8-213880

[51] Int. Cl.⁶ .......................................................... G11C 7/00
[52] U.S. Cl. .......................................... 365/194; 365/233
[58] Field of Search ................................... 365/194, 210, 365/233

[56] References Cited

U.S. PATENT DOCUMENTS

| | | | |
|---|---|---|---|
| 5,313,422 | 5/1994 | Houston | 365/194 |
| 5,313,438 | 5/1994 | Hieda et al. | 365/238 |
| 5,440,514 | 8/1995 | Flannagan et al. | 365/194 |
| 5,493,538 | 2/1996 | Bergman | 365/233.5 |
| 5,504,715 | 4/1996 | Lee et al. | 365/230.06 |
| 5,553,033 | 9/1996 | McAdams | 365/233.5 |
| 5,557,580 | 9/1996 | Numaga et al. | 365/230.06 |
| 5,566,108 | 10/1996 | Kitamura et al. | 365/233 |
| 5,566,130 | 10/1996 | Durham et al. | 365/233.5 |
| 5,740,123 | 4/1998 | Uchida | 365/233 |

FOREIGN PATENT DOCUMENTS

| | | |
|---|---|---|
| 662 756 A1 | 7/1995 | European Pat. Off. . |
| 5-159080 | 6/1993 | Japan . |

Primary Examiner—David C. Nelms
Assistant Examiner—Hien Nguyen
Attorney, Agent, or Firm—Nikaido, Marmelstein, Murray & Oram LLP

[57] ABSTRACT

A semiconductor integrated circuit has first and second delay controllers for receiving an input signal, a plurality of object circuits for receiving an internal signal from the first delay circuit through a real line, and a phase comparator. The phase comparator receives the input signal and a dummy internal signal from the second delay controller through a dummy line, and compares the phases of the received signals with each other. Further, the phase comparator controls delays in the first and second delay controllers according to the comparison result. The length of the real line from the first delay controller to any one of the object circuits is substantially identical, and a load value of the dummy line is substantially equal to that of the real line between the first delay controller and any one of the object circuits. Therefore, each of the object circuits or pads receives a phase-locked control signal without regard to the physical position thereof.

42 Claims, 22 Drawing Sheets

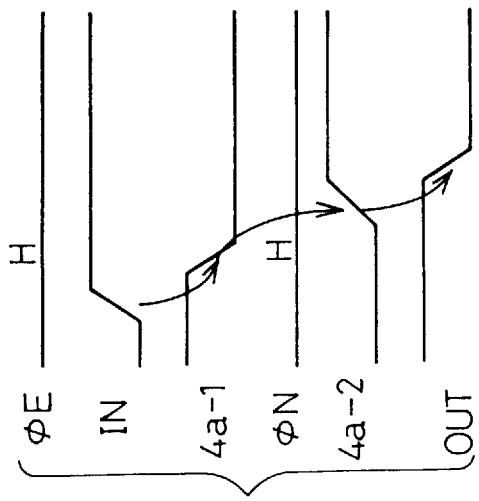
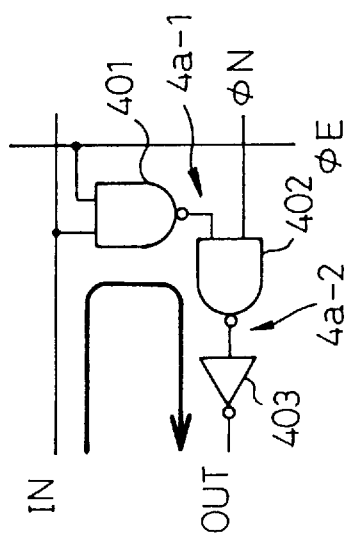
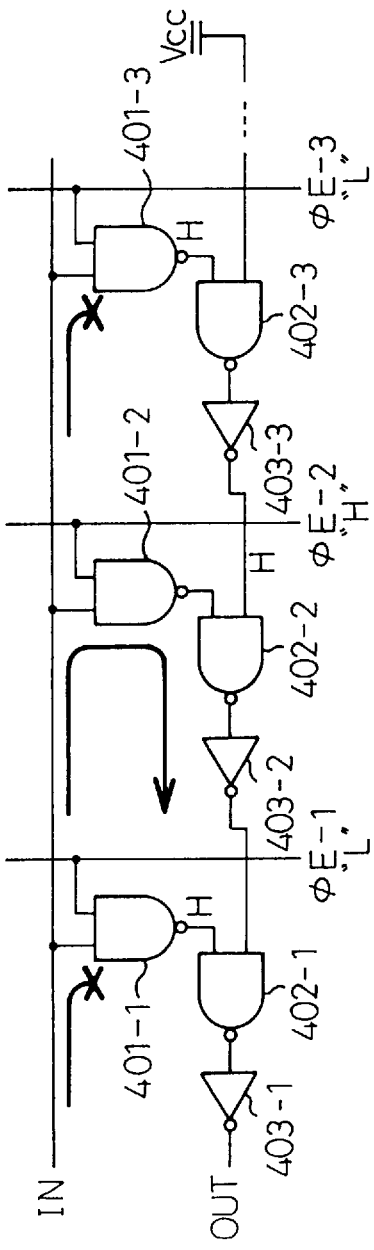

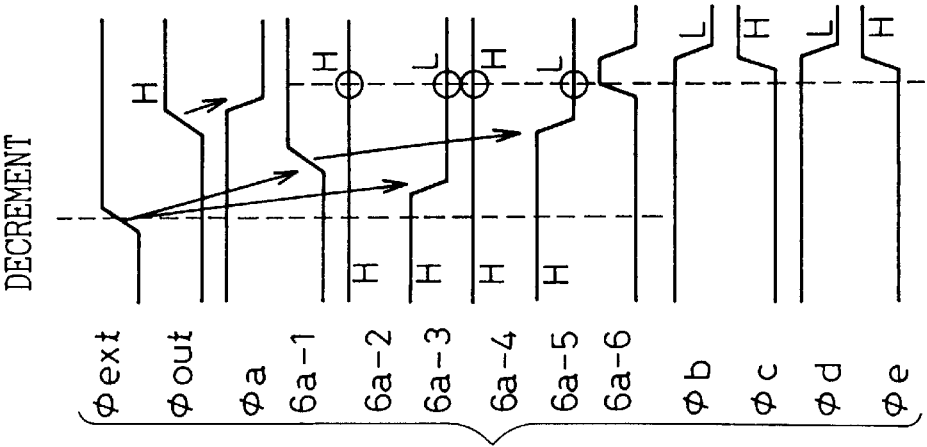
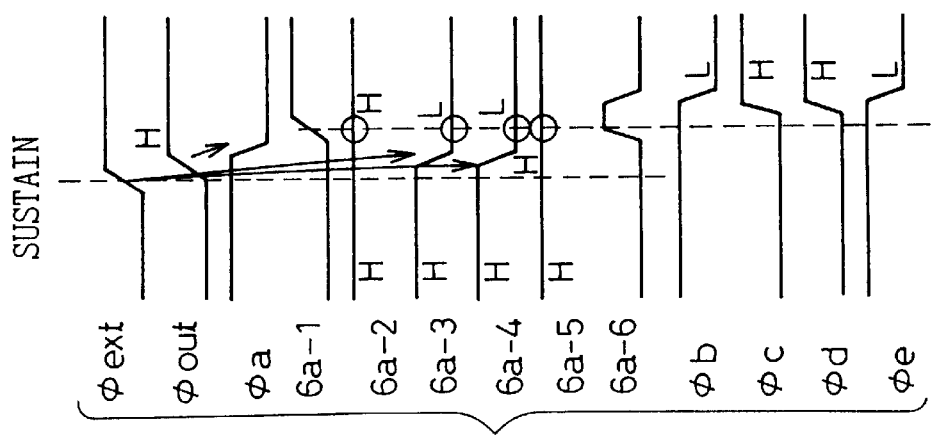
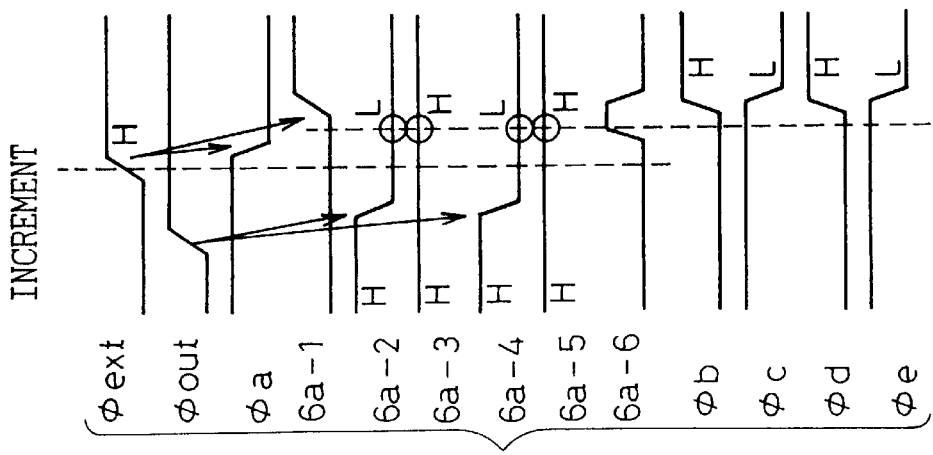

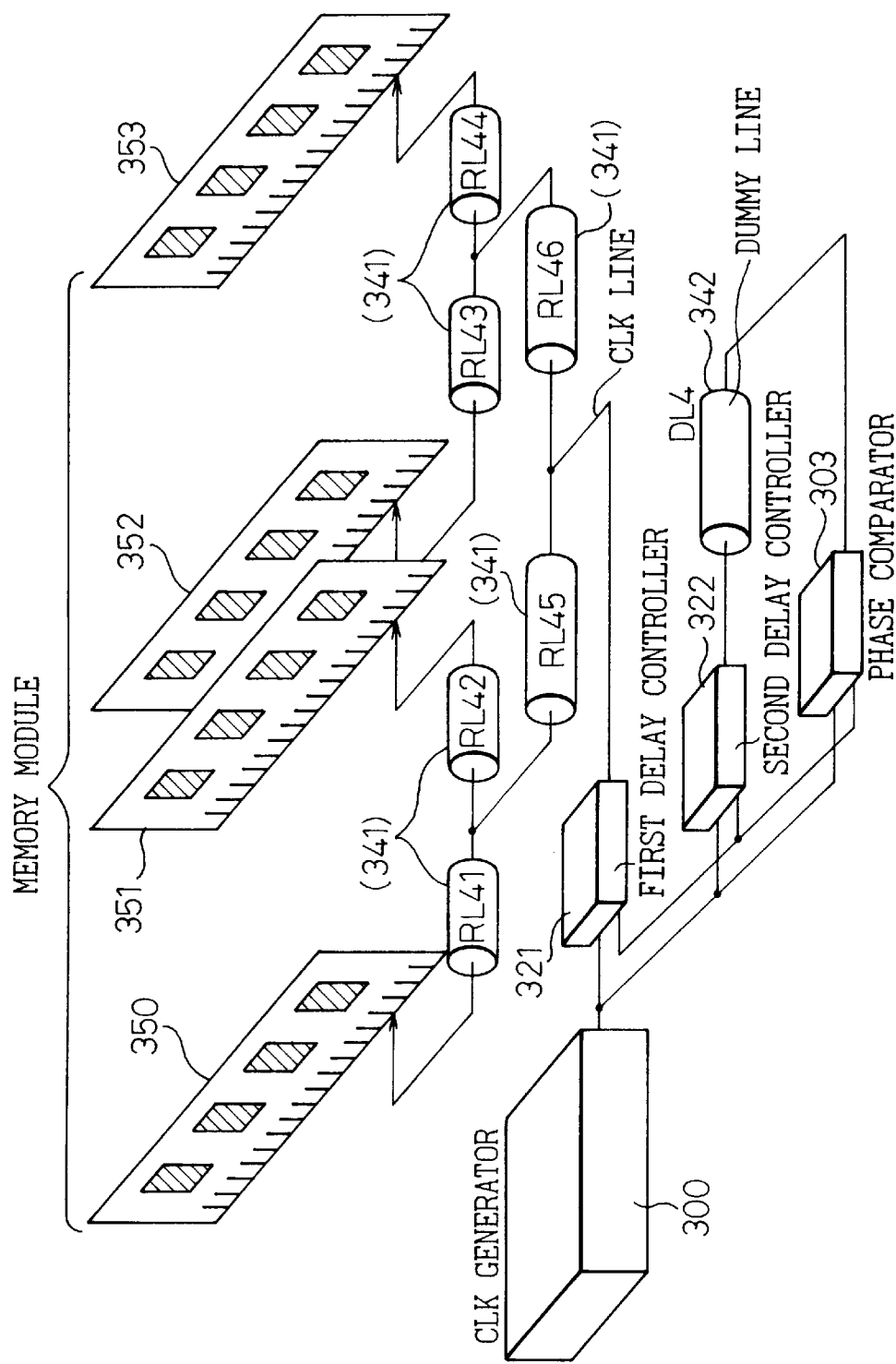

SEMICONDUCTOR INTEGRATED CIRCUIT FOR SUPPLYING A CONTROL SIGNAL TO A PLURALITY OF OBJECT CIRCUITS

BACKGROUND OF THE INVENTION

1. Field of the Invention P The present invention relates to a semiconductor integrated circuit, a semiconductor integrated circuit module, and a semiconductor integrated circuit system, for supplying a phase-locked control signal to a plurality of object circuits.

2. Description of the Related Art

Recent memory devices operate at a high speed of, for example, over 100 MHz, and therefore, employ a DLL (delay locked line) circuit to lock the phase of an internal clock signal with respect to the phase of an external clock signal, thereby suppressing an access delay or an access fluctuation in internal clock signal lines.

The DLL circuit employs a dummy line for transmitting a dummy internal clock signal and estimates a propagation delay due to load on a real line for transmitting an actual internal clock signal.

Namely, a high-speed and highly-integrated semiconductor circuit requires a phase-locked clock signal for some elements and output pads formed therein. For example, a synchronous DRAM (SDRAM) requires a phase-locked clock signal for output buffers that are formed at different locations on the SDRAM chip. Not only the semiconductor integrated circuits but also semiconductor integrated circuit modules such as memory modules and semiconductor integrated circuit systems such as memory systems need phase-locked clock signals and phase-locked control signals.

The prior arts and their associated problems will be described in detail later with reference to the accompanying drawings.

SUMMARY OF THE INVENTION

An object of the present invention is to supply a phase-locked control signal to elements and pads that are formed at different locations on a semiconductor chip. Another object of the present invention is to supply a phase-locked control signal to elements and pads in a semiconductor integrated circuit module or a semiconductor integrated circuit system.

According to the present invention, there is provided a semiconductor integrated circuit having first and second delay controllers for receiving an input signal; a plurality of object circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that a length of the real line from the first delay controller to any one of the object circuits is substantially identical; and a load value of the dummy line is substantially equal to that of the real line between the first delay controller and a specific one of the object circuits.

A length of the dummy line may be substantially equal to the length of the real line between the first delay controller and the specific one of the object circuits. The real line may have a tree shape between the first delay controller and the object circuits so as to determine the length of the real line to any one of the object circuits to be identical.

According to the present invention, there is also provided a semiconductor integrated circuit having first and second delay controllers for receiving an input signal; a plurality of object circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that the real line from the first delay controller to the object circuits has a symmetrical tree shape; and a load value of the dummy line is substantially equal to that of the real line between the first delay controller and any one of the object circuits.

A length of the dummy line may be substantially equal to a length of the real line between the first delay controller and any one of the object circuits.

Further, according to the present invention, there is also provided a semiconductor integrated circuit having first and second delay controllers for receiving an input signal; a plurality of object circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that the object circuits are arranged in groups each having a node for receiving the internal signal output from the first delay controller, the real line from the first delay controller to the nodes is laid out in a symmetrical tree shape, and a load value of the dummy line is substantially equal to that of the real line between the first delay controller and a specific one of the nodes.

A length of the dummy line may be substantially equal to a length of the real line between the first delay controller and the specific one of the object circuits.

The input signal may be a clock signal for supply to the object circuits. The semiconductor integrated circuit may be a synchronous DRAM, and the object circuits may be data output buffer circuits of the synchronous DRAM. The input signal may be an enable signal for each of the data output buffer circuits.

According to the present invention, there is provided a semiconductor integrated circuit module having first and second delay controllers for receiving an input signal; a plurality of object semiconductor integrated circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that a length of the real line from the first delay controller to any one of the object semiconductor integrated circuits is substantially identical; and a load value of the dummy line is substantially equal to that of the real line between the first delay controller and a specific one of the object semiconductor integrated circuits.

A length of the dummy line may be substantially equal to the length of the real line between the first delay controller and the specific one of the object semiconductor integrated circuits. The real line may have a tree shape between the first delay controller and the object semiconductor integrated circuits so as to determine the length of the real line to any one of the object semiconductor integrated circuits to be identical.

According to the present invention, there is also provided a semiconductor integrated circuit module having first and second delay controllers for receiving an input signal; a plurality of object semiconductor integrated circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that the real line from the first delay controller to the object semiconductor integrated circuits has a symmetrical tree shape; and a load value of the dummy line is substantially equal to that of the real line between the first delay controller and any one of the object semiconductor integrated circuits.

A length of the dummy line may be substantially equal to a length of the real line between the first delay controller and any one of the object semiconductor integrated circuits.

Further, according to the present invention, there is provided a semiconductor integrated circuit module having first and second delay controllers for receiving an input signal; a plurality of object semiconductor integrated circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that the object semiconductor integrated circuits are arranged in groups each having a node for receiving the internal signal output from the first delay controller, the real line from the first delay controller to the nodes is laid out in a symmetrical tree shape, and a load value of the dummy line is substantially equal to that of the real line between the first delay controller and a specific one of the nodes.

A length of the dummy line may be substantially equal to a length of the real line between the first delay controller and the specific one of the object semiconductor integrated circuits.

The semiconductor integrated circuit module may be a memory module, and each of the object semiconductor integrated circuits may be a memory chip of the memory module. The input signal may be a clock signal, and an input terminal of each of the object semiconductor integrated circuits may be a clock input terminal.

According to the present invention, there is provided a semiconductor integrated circuit system having first and second delay controllers for receiving an input signal; a plurality of object semiconductor integrated circuit modules for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that a length of the real line from the first delay controller to any one of the object semiconductor integrated circuit modules is substantially identical; and a load value of the dummy line is substantially equal to that of the real line between the first delay controller and a specific one of the object semiconductor integrated circuit modules.

A length of the dummy line may be substantially equal to the length of the real line between the first delay controller and the specific one of the object semiconductor integrated circuit modules. The real line may have a tree shape between the first delay controller and the object semiconductor integrated circuit modules so as to determine the length of the real line to any one of the object semiconductor integrated circuit modules to be identical.

According to the present invention, there is also provided a semiconductor integrated circuit system having first and second delay controllers for receiving an input signal; a plurality of object semiconductor integrated circuit modules for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that the real line from the first delay controller to the object semiconductor integrated circuit modules has a symmetrical tree shape; and a load value of the dummy line is substantially equal to that of the real line between the first delay controller and any one of the object semiconductor integrated circuit modules.

A length of the dummy line may be substantially equal to a length of the real line between the first delay controller and any one of the object semiconductor integrated circuit modules.

In addition, according to the present invention, there is provided a semiconductor integrated circuit system having first and second delay controllers for receiving an input signal; a plurality of object semiconductor integrated circuit modules for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, characterized in that the object semiconductor integrated circuit modules are arranged in groups each having a node for receiving the internal signal output from the first delay controller, the real line from the first delay controller to the nodes is laid out in a symmetrical tree shape, and a load value of the dummy line is substantially equal to that of the real line between the first delay controller and a specific one of the nodes.

A length of the dummy line may be substantially equal to a length of the real line between the first delay controller and the specific one of the object semiconductor integrated circuit modules. Each of the object semiconductor integrated circuit modules may be a memory module, and an input terminal of each of the object semiconductor integrated circuit modules may be a clock input terminal.

According to the present invention, there is provided a semiconductor integrated circuit having first and second delay controllers for receiving an input signal; a plurality of object circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, wherein a load value of the dummy line is substantially equal to that of an average length of the real lines from the first delay controller to the plurality of object circuits.

Further, according to the present invention, there is also provided a semiconductor integrated circuit module having first and second delay controllers for receiving an input signal; a plurality of object semiconductor integrated circuits for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, wherein a load value of the dummy line is substantially equal to that of an average length of the real lines from the first delay controller to the plurality of object semiconductor integrated circuits.

In addition, according to the present invention, there is provided a semiconductor integrated circuit system having first and second delay controllers for receiving an input signal; a plurality of object semiconductor integrated circuit modules for receiving an internal signal output from the first delay circuit through a real line; and a phase comparator for receiving the input signal and a dummy internal signal output from the second delay controller through a dummy line, for comparing phases of the received input and dummy internal signals with each other, and for controlling delays in the first and second delay controllers in accordance with the comparison result, wherein a load value of the dummy line is substantially equal to that of an average length of the real lines from the first delay controller to the plurality of object semiconductor integrated circuit modules.

BRIEF DESCRIPTION OF THE DRAWINGS

The present invention will be more clearly understood from the description of preferred embodiments as set forth below with reference to the accompanying drawings, wherein:

FIGS. 6A to 6C show a delay section of a delay controller according to the present invention;

FIGS. 10A to 10C are timing charts showing the operation of the phase comparing section of FIG. 9;

FIG. 22 shows a memory system according to the present invention.

DESCRIPTION OF THE PREFERRED EMBODIMENTS

For a better understanding of the preferred embodiments of the present invention, a prior art and the problem thereof will be explained with reference to FIGS. 1 to 3.

Figure 1:
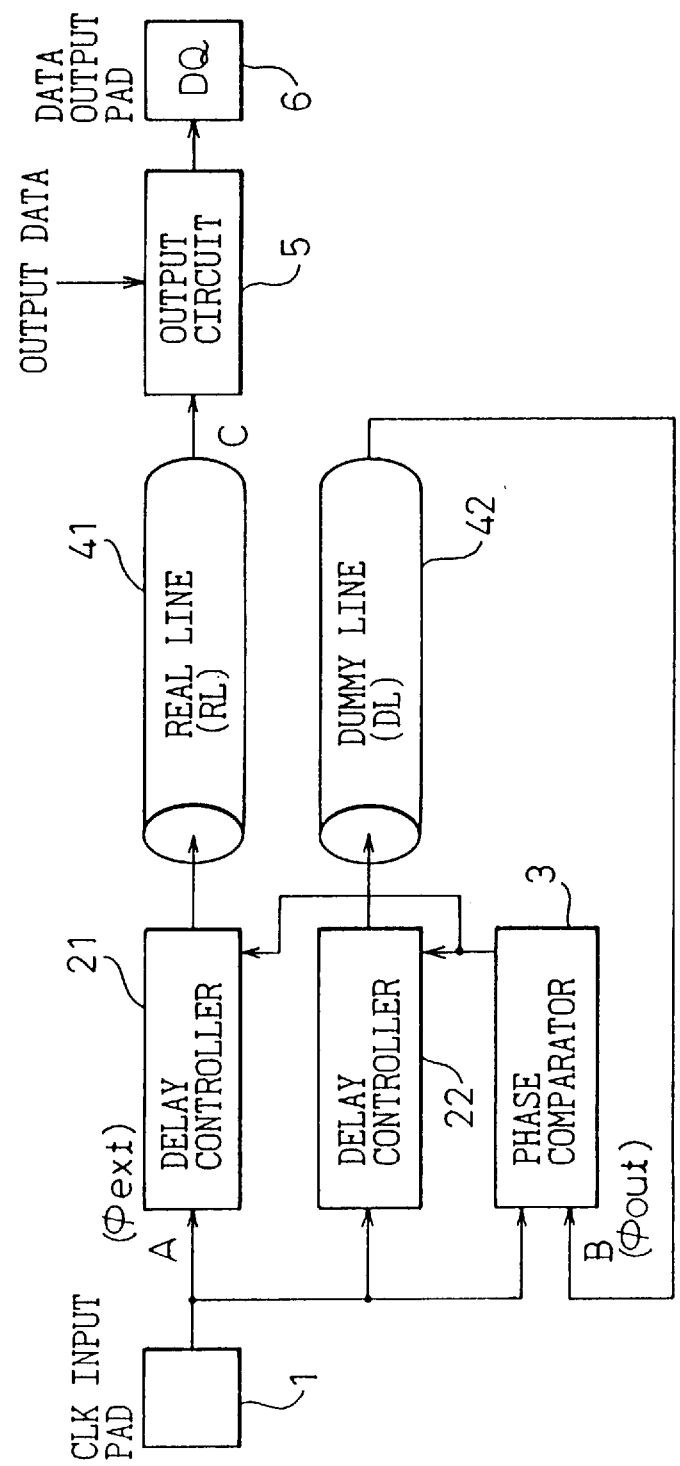
FIG. 1 is a block diagram showing a semiconductor integrated circuit according to a prior art.

FIG. 1 is a block diagram showing an example of the DLL circuit according to the prior art. The circuit has a clock signal input pad 1, an output circuit 5 serving as an object circuit, a data output pad 6, a phase comparator 3, delay controllers 21 and 22 that control delays in response to the output of the phase comparator 3, a real line 41 for transmitting an internal clock signal from the delay controller 21 to the output circuit 5, and a dummy line 42 having the same load as the real line 41, for transmitting a dummy internal clock signal.

The phase comparator 3 compares the phase of an input signal A, which is a reference signal $\phi$ext and is also supplied to the delay controllers 21 and 22, with the phase of an input signal B, which is a comparison object signal $\phi$out, i.e., the dummy signal. According to the comparison result, the delay controllers 21 and 22 control delays therein so that the signal B is behind the signal A by one clock period. As a result, the internal clock signal supplied to the output circuit 5 is behind the input signal A by one clock period, to apparently suppress a propagation delay in the real line 41. Using the dummy line 42 for controlling a delay in the real line 41 is advantageous because the dummy and real lines 42 and 41 do not restrict each other's location on a chip. This expands the freedom of designing and wiring the circuit.

Figure 2:
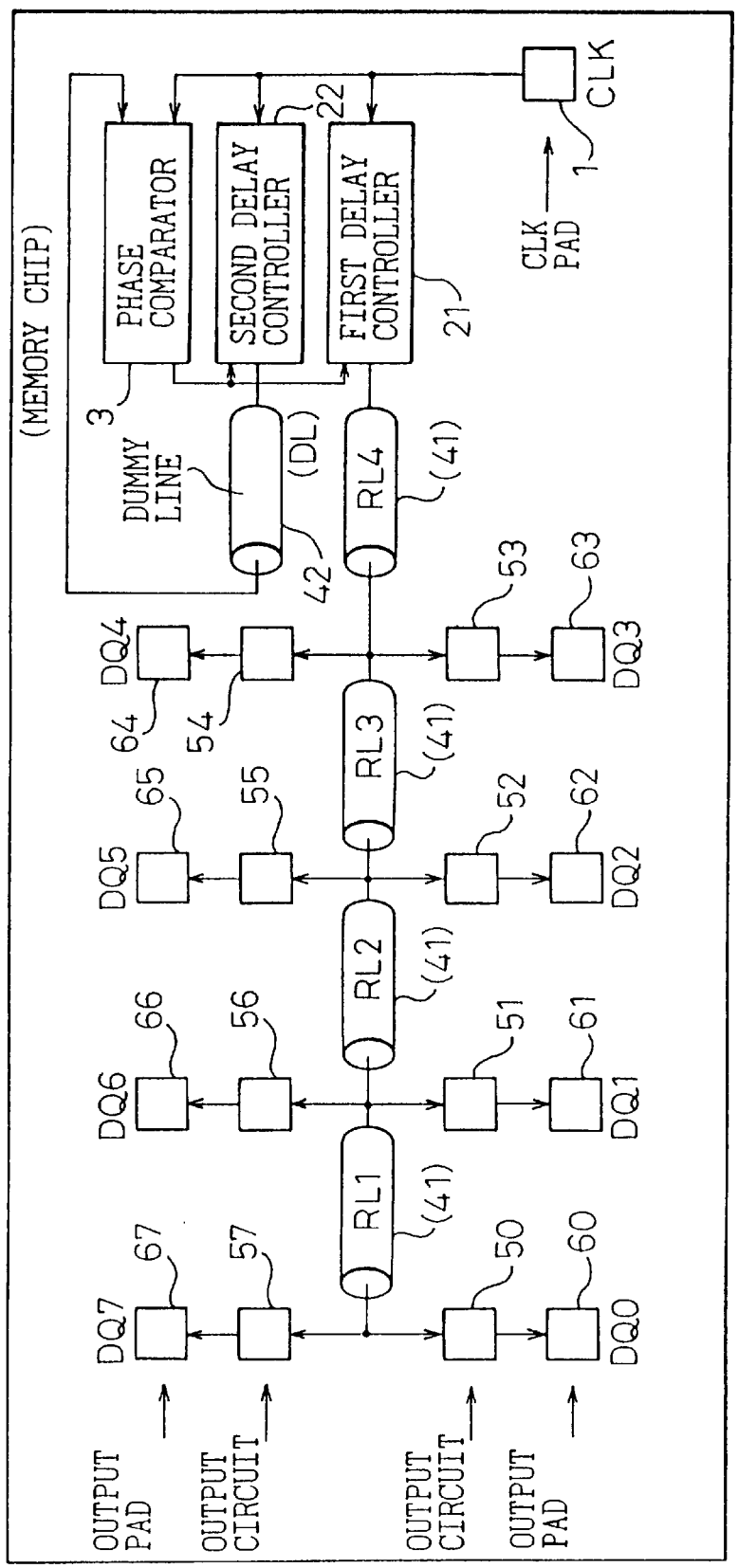
FIG. 2 is a block diagram showing lines for transmitting a clock signal in the circuit of FIG. 1.

FIG. 2 shows lines for transmitting the internal clock signal in the circuit of the prior art of FIG. 1 and explains the problem thereof. The circuit has output circuits 50 to 57 and data output pads 60 to 67 (DQ0 TO DQ7) formed on, for example, an SDRAM chip. The output circuits 50 to 57 serve as output buffers of the SDRAM.

The output circuits 50 to 57 and output pads 60 to 67 are formed at different locations on the chip. Accordingly, the lengths of the real line 41 to the output circuits 50 to 57 are different from one another and involve different loads. If the length DL of the dummy line 42 is adjusted to any one of the lengths of the real line 41, errors will occur in the other lengths.

If the length DL of the dummy line 42 is adjusted to, for example, the length RL4 of the real line 41 between the first delay controller 21 and the output circuit 53 (54), the phase of the internal clock signal supplied to the output circuit 53 (54) will synchronize with the phase of the external clock signal supplied to the pad 1. However, the phase of the internal clock signal to the farthest output circuit 50 (57) will involve a propagation delay corresponding to a length difference of RL1+RL2+RL3 between the length DL (=RL4) of the dummy line 42 and the length RL1+RL2+RL3+RL4 of the real line 41 from the first delay controller 21 to the output circuit 50 (57).

Figure 3:
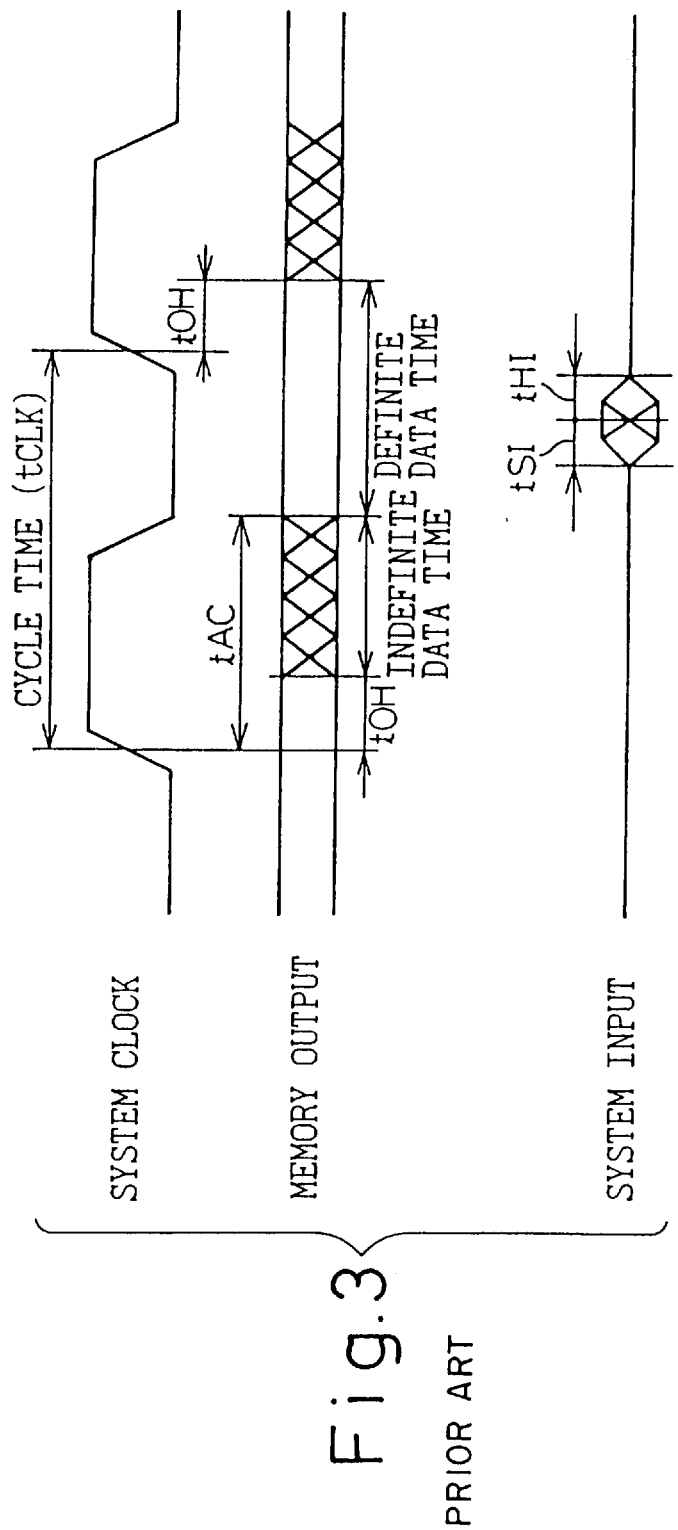
FIG. 3 explains the problem of the circuit of FIG. 2.

FIG. 3 explains the problem of the prior art of FIG. 2 when applied to an SDRAM.

In FIG. 3, tAC is a memory access time based on a system clock signal CLK, and tOH is an output data hold time. Due to the property fluctuation, temperature dependency, and source-voltage dependency of the SDRAM, there is a time difference between tAC and tOH. The time difference is a dead band in which data is indefinite and unusable by a memory system. The dead band may also be extended due to, for example, a wiring delay and a delay fluctuation.

To fetch the output of the SDRAM, a system needs a setup time tSI and a hold time tHI that must be secured in a period in which the output of the SDRAM is definite. Namely, tSI and tHI must be within a period of tCLK+tOH−tAC.

If the memory system operates at 100 MHz, examples of tCLK, tAC, and tOH are 10 ns, 6 ns, and 3 ns, respectively. Then, a period of 7 ns is available for the system. Generally, tSI+tHI=3 ns, and therefore, the remaining 4 ns is a margin for signal delays and terminal fluctuations in the system. This margin is very severe in consideration of a signal propagation speed. If the operation speed of the system is faster, a severer timing adjustment is needed. It is, therefore, very important to minimize an indefinite data time shown in FIG. 3.

To shorten the indefinite data time, output data must have a predetermined phase with respect to the phase of the external clock signal CLK, i.e., the memory access time tAC must always be constant even if the output circuits 50 to 57 are formed at different locations as shown in FIG. 2. If output data must be synchronized with a rise of the external clock signal CLK, tAC must always be zero.

Synchronizing an output signal with an external clock signal is important not only for the SDRAM but also for other semiconductor integrated circuits. In a given semiconductor integrated circuit, there may be various measures to be taken to let elements thereof operate in required ways. When providing data outside from the integrated circuit, it is important to lock the timing of outputting the data so that the data can be used by other circuits.

The simplest way to avoid the propagation delay due to the different lengths of the real line 41 to the output circuits 50 to 57 is to provide the dummy line 42, phase comparator 3, and delay controllers 21 and 22 for each of the output circuits 50 to 57. This, however, increases a chip area and power consumption. This problem of the prior art commonly occurs in semiconductor integrated circuits such as memory chips, semiconductor integrated circuit modules such as memory modules, and semiconductor integrated circuit systems such as memory systems.

Next, preferred embodiments of the present invention will be explained with reference to the drawings.

Figure 4:
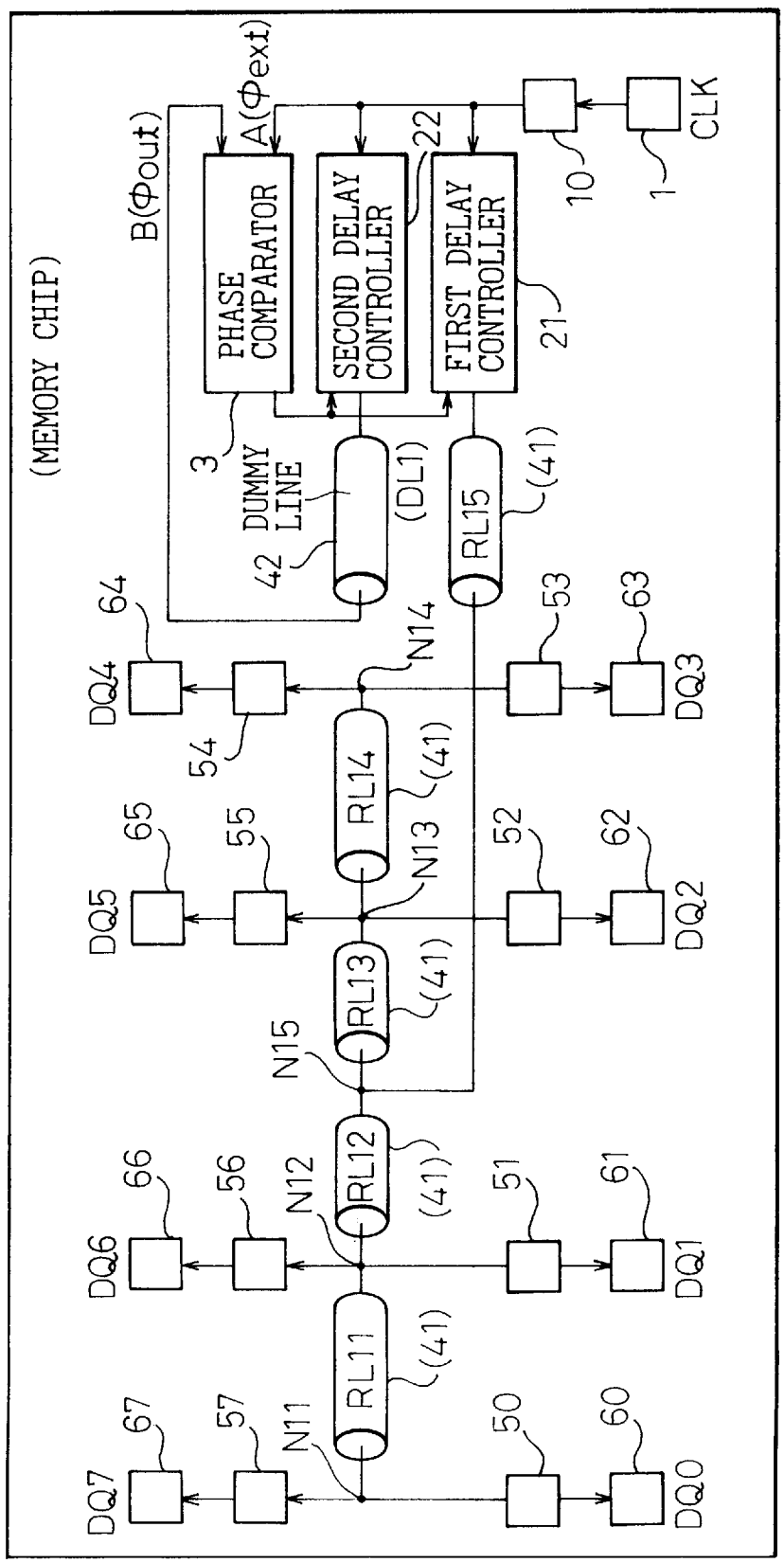
FIG. 4 is a block diagram showing a semiconductor integrated circuit according to an embodiment of the present invention.

FIG. 4 is a block diagram showing a DLL circuit in a semiconductor integrated circuit according to a first embodiment of the present invention. The circuit has an input pad 1 for receiving an external clock signal CLK, a clock signal buffer 10, output circuits 50 to 57 serving as object circuits, data output pads 60 to 67 (DQ0 to DQ7), a first delay controller 21, a second delay controller 22, a phase comparator 3, a real line 41 for transmitting an internal clock signal, and a dummy line 42 for transmitting a dummy internal clock signal.

In response to the external clock signal CLK supplied through the input pad 1, the buffer 10 provides a signal A ($\phi$ext) serving as a reference signal to the delay controllers 21 and 22 and phase comparator 3. The delay controller 21 provides an internal clock signal to the output circuits 50 to 57 through the real line 41. The delay controller 22 provides a dummy internal clock signal B ($\phi$out) to the phase comparator 3 through the dummy line 42. The phase comparator 3 compares the phases of the signals A and B with each other and, according to the comparison result, controls delays in the delay controllers 21 and 22.

The output circuits 50 to 57 and data output pads 60 to 67 are formed at different locations on a chip. A node N15 is connected to the delay controller 21 through a length RL15 of the real line 41. The node N15 is so positioned to halve the length RL2 (FIG. 2) of the real line 41 into lengths RL12 and RL13. In the real line 41, a length RL11 extends between nodes N11 and N12, the length RL12 between the nodes N15 and N12, the length RL13 between the nodes N15 and N13, a length RL14 between the nodes N13 and N14, and the length RL15 between the node N15 and the delay controller 21, where RL12=RL13 (=½(RL2)), and RL11=RL14.

The length DL1 of the dummy line 42 is equal to RL15+RL13, or RL15+RL12 of the real line 41. As a result, a rise or fall of the internal clock signal to the output circuits 52, 55, 51, and 56 agrees with a rise or fall of the clock signal A, thereby eliminating an error in the timing of supplying the internal clock signal to the output circuits. Since the output circuits 53, 54, 50, and 57 are not provided with a dummy line for the length RL14 or RL11 of the real line 41, they may have a propagation error corresponding to the length. This, however, is smaller than the propagation error on the output circuits 50 and 57 of FIG. 2.

In this way, the first embodiment forms the real line 41 having a symmetrical tree shape between the delay controller 21 and the output circuits 50 to 57, as well as the dummy line 42 with its length DL1 being substantially equal to the length of the real line 41 between the delay controller 21 and a proper one of the nodes connected to the output circuits. A delay in the real line 41 is canceled with the use of the dummy line 42, so that the location of the DLL circuit in a given semiconductor integrated circuit is unlimited to expand the freedom of designing and wiring the circuit.

Figure 5:
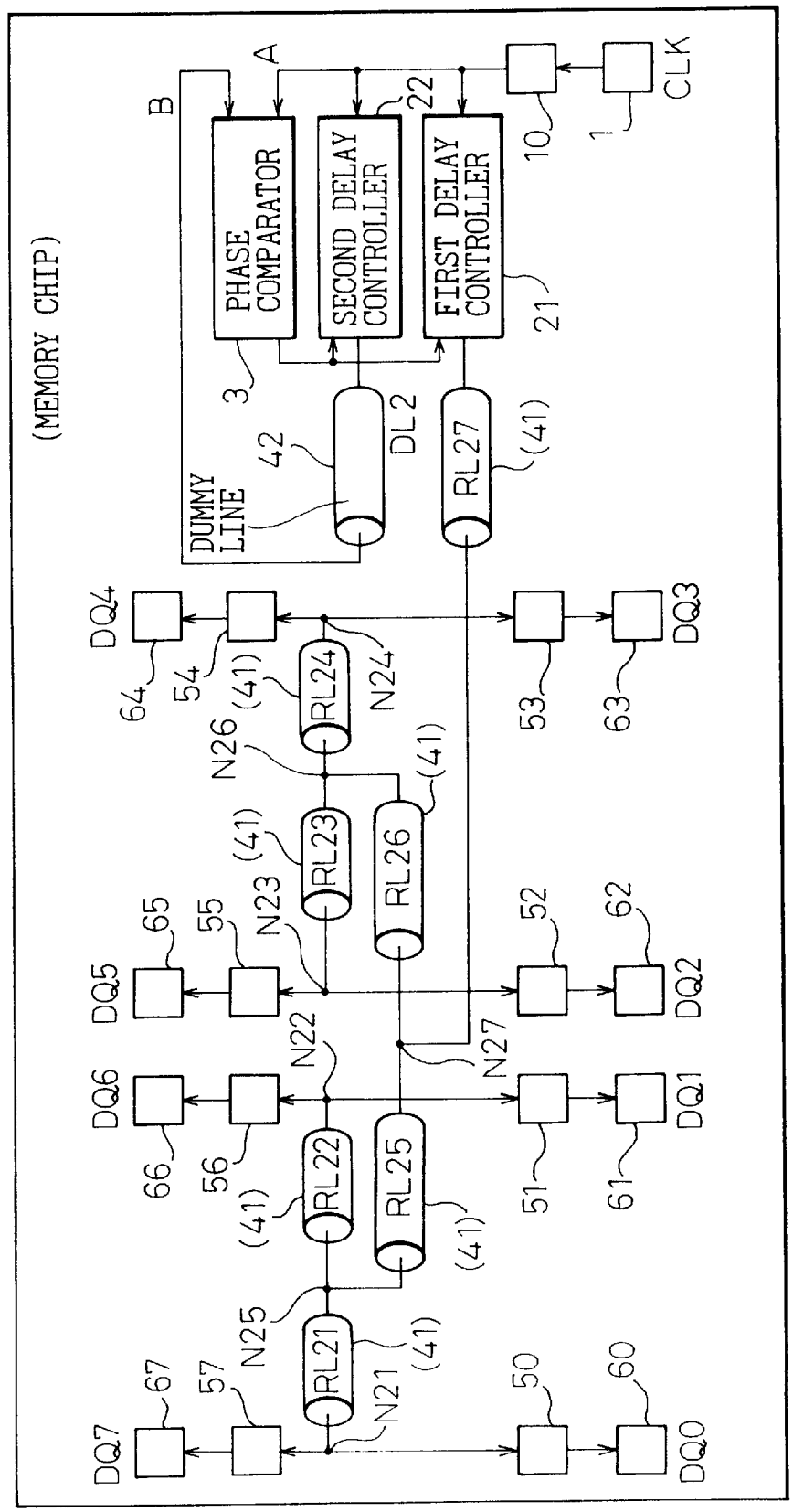
FIG. 5 is a block diagram showing a semiconductor integrated circuit according to another embodiment of the present invention.

FIG. 5 is a block diagram showing a DLL circuit in a semiconductor integrated circuit according to another embodiment of the present invention. First and second delay controllers 21 and 22, a phase comparator 3, etc., are the same as those of the embodiment of FIG. 4. A real line 41 has a length RL27 between the delay controller 21 and a node N27, a length RL25 between the nodes N27 and N25, a length RL26 between the nodes N27 and N26, a length RL21 between the nodes N25 and N21, a length RL22 between the nodes N25 and N22, a length RL23 between the nodes N26 and N23, and a length RL24 between the nodes N26 and N24.

The length of the real line 41 between the delay controller 21 and any one of output circuits 50 to 57 is equalized with RL25=RL26, and RL21=RL22=RL23=RL24. Namely, the length RL27+RL25+RL21 of the real line 41 from the delay controller 21 to the output circuit 50 (57) is equal to the length RL27+RL25+RL22 to the output circuit 51 (56), which is equal to the length RL27+RL26+RL23 to the output circuit 52 (55), which is equal to the length RL27+RL26+RL24 to the output circuit 53 (54).

The length DL2 of a dummy line 42 is equalized to the length RL27+RL25+RL21 (=RL27+RL25+RL22=RL27+RL26+RL23=RL27+RL26+RL24) of the real line 41, to synchronize the output timing of the data output pads 60 to 67 with one another. This results in synchronizing the data read timing of an SDRAM that employs the DLL circuit of the present invention. It is possible to remove the delay controller 22 and dummy line 42 and connect the node N24 to the phase comparator 3, so that the phase comparator 3 compares a signal from the node N24 with the external clock signal CLK from the input pad 1. In this case, the node N24 must be arranged close to the phase comparator 3 to avoid a delay between them. This results in restricting the layout of the circuit. If the node N24 is adjacent to the phase comparator 3, a delay will occur to break synchronization between the external clock signal CLK and the internal clock signal supplied to the output circuits 50 to 57. To avoid these problems, the present invention employs the second delay controller 22 and dummy line 42.

FIGS. 6A to 6C show a delay section of any one of the delay controllers 21 and 22, in which FIG. 6A shows a 1-bit delay element, FIG. 6B is a time chart showing the operation of the 1-bit delay element, and FIG. 6C shows cascaded 1-bit delay elements.

The 1-bit delay element has two NAND gates 401 and 402 and an inverter 403. An enable signal φE is high in FIG. 6B to activate the 1-bit delay element. The 1-bit delay element receives an input signal IN and a signal φN, which is an output signal of another 1-bit delay element on the right side, and provides an output signal OUT. Nodes 4a-1 and 4a-2 provide waveforms shown in FIG. 6B. The output signal OUT is a signal φN to another 1-bit delay element on the left side.

When the signal φN is low, the output signal OUT is always low. If the signal φN is high and the signal φE is low, the output signal OUT is high. If the signal φN is high with the signal φE being high and the input signal IN being low, the output signal OUT is high, and with the input signal IN being high, the output signal OUT is low.

If the input signal IN rises with the enable signal φE being high, the input signal IN is transmitted through a path indicated with an arrow mark. If the enable signal φE is low, the input signal IN is blocked from the path.

In FIG. 6C, the 1-bit delay elements are cascaded to form the delay section of the delay controller 21 (22). Although FIG. 6C shows only three 1-bit delay elements, many elements are cascaded in reality, and each element is provided with a signal line such as φE-1, φE-2, or φE-3 each for transmitting an enable signal φE. These enable signals are controlled by a control section of the delay controller 21 (22).

In FIG. 6C, the enable signal φE-2 is high to activate the center 1-bit delay element. If the input signal IN changes from low to high, the NAND gates 401-1 and 401-3 of the left and right 1-bit delay elements block the input signal IN because their enable signals φE-1 and φE-3 are each low.

On the other hand, the NAND gate 401-2 of the center 1-bit delay element passes the input signal IN because its enable signal φE-2 is high. The NAND gate 402-2 thereof also passes the input signal IN because the output signal OUT (φN) of the right 1-bit delay element is high. Then, the center 1-bit delay element provides the low output signal OUT. If the output signal OUT (φN) of the right 1-bit delay element is low, the output signal OUT of the 1-bit delay element that receives the output signal is always low. Accordingly, the output signal OUT of the center 1-bit delay element is transmitted through the NAND gate and inverter of the left 1-bit delay element and is provided as a final output signal.

In this way, the input signal IN is transmitted through an activated 1-bit delay element, to form a final output signal. Namely, controlling the enable signal φE of a required 1-bit delay element to high will control a delay in the delay controller 21 (22). The delay of a 1-bit delay element is determined by the total signal propagation time of the NAND gates and inverter of the element and forms a unit delay time. A total delay time is calculated by multiplying the number of 1-bit delay elements passed by the input signal IN by the unit delay time.

Figure 7:
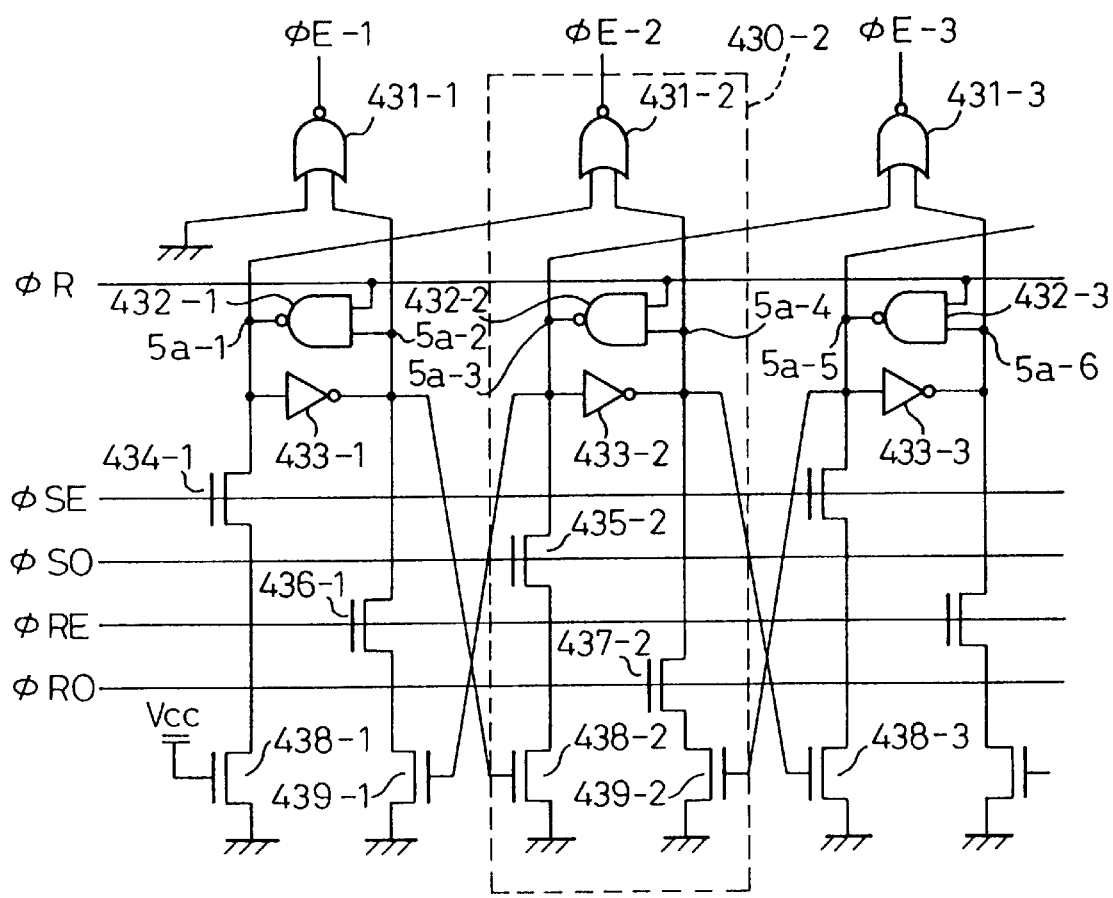
FIG. 7 shows a control section of the delay controller.

FIG. 7 shows a control section of the delay controller 21 (22) of the present invention.

The control section consists of 1-bit control elements among which one surrounded with a dotted line in FIG. 7 is a 1-bit control element 430-2. Each element provides an enable signal φE to a corresponding one of the 1-bit delay elements (FIG. 6).

The 1-bit control element 430-2 consists of a flip-flop having a NAND gate 432-2 and an inverter 433-2, transistors 435-2, 437-2, 438-2, and 439-2, and a NOR gate 431-2. The gate of the transistor 438-2 is connected to a node 5a-2 of a front 1-bit control element. The gate of the transistor 439-2 is connected to a node 5a-5 of a rear 1-bit control element. Incremental signals, i.e., set signals φSE and φSO and decremental signals, i.e., reset signals φRE and φRO are connected alternately to the 1-bit control elements.

In the center 1-bit control element 430-2, the gate of the transistor 435-2 receives the set signal φSO, and the gate of the transistor 437-2 receives the reset signal φRO. The gates of the corresponding transistors of the front and rear 1-bit control elements receive the set signal φSE and reset signal φRE. The NOR gate 431-2 receives a signal from a node 5a-1 of the front element and a signal from a node 5a-4 of its own. A signal φR resets the delay controller 21 (22). The signal φR is once set to low when a power source is turned on and is fixed to high thereafter.

Figure 8:
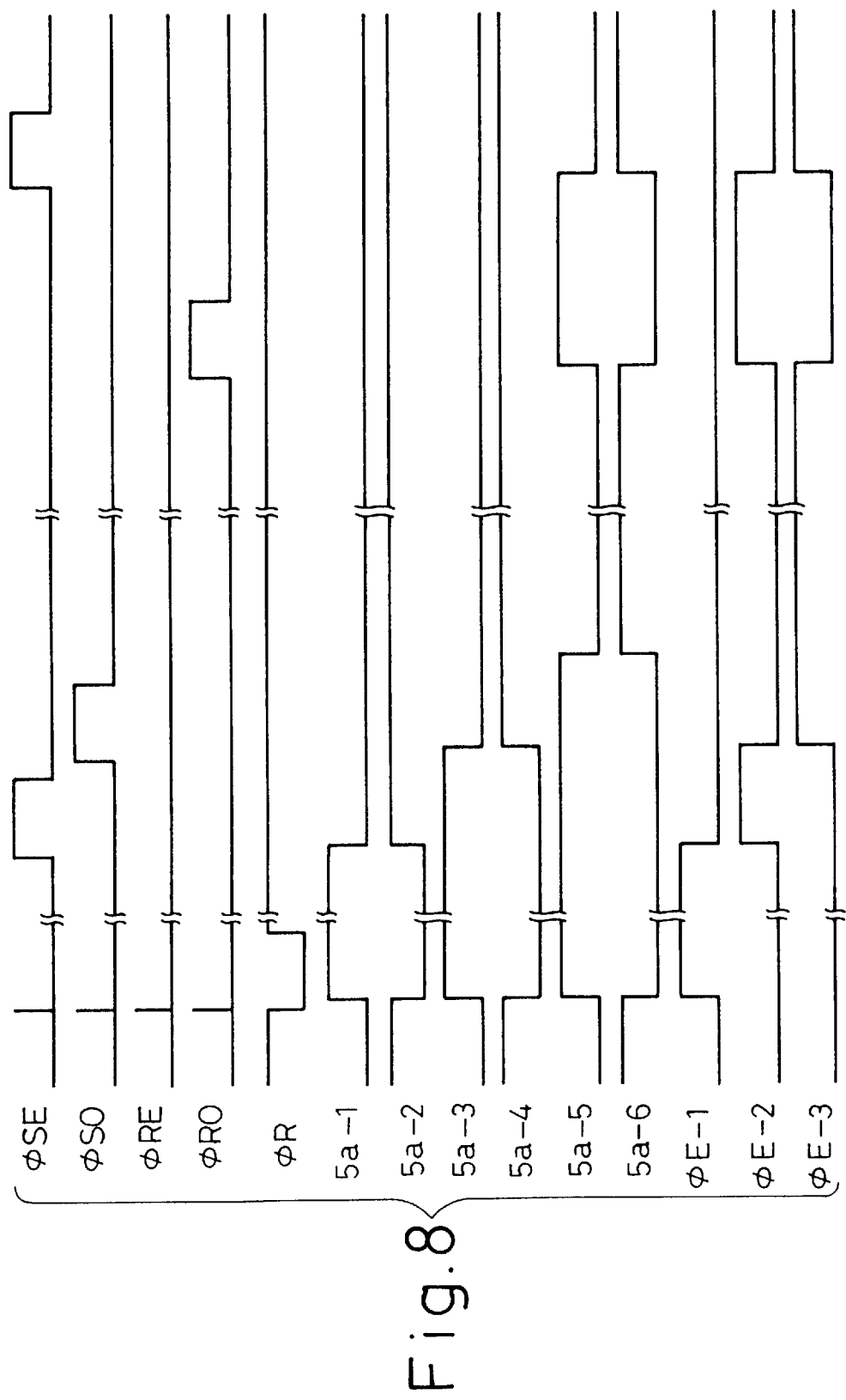
FIG. 8 is a timing chart showing the operation of the control section of FIG. 7.

FIG. 8 is a timing chart showing the operation of the circuit of FIG. 7.

The reset signal φR is once set to low so that the nodes 5a-1, 5a-3, and 5a-5 are set to high and the nodes 5a-2, 5a-4, and 5a-6 to low. To carry out an incremental operation, the incremental signals, i.e., the set signals φSE and φSO are set to high and low alternately.

When the set signal φSE is changed from low to high, the node 5a-1 is grounded to low, and the node 5a-2 is changed to high. Accordingly, the enable signal φE-1 changes from high to low. This state is latched by the flip-flop, and therefore, the enable signal φE-1 keeps the low level even if the set signal φSE returns to low. When the node 5a-1 changes to low, the enable signal φE-2 changes from low to high. When the node 5a-2 changes to high, the transistor 438-2 is turned on. When the set signal φSO changes from low to high, the node 5a-3 is grounded to low, and the node 5a-4 changes to high. As a result, the enable signal φE-2 changes from high to low. This state is latched by the flip-flop, and therefore, the enable signal φE-2 keeps the low level even if the set signal φSO returns to low.

When the node 5a-3 changes to low, the enable signal φE-3 changes from low to high. Although FIG. 8 shows each one pulse of the set signals φSE and φSO, many 1-bit control elements are connected to one another in reality. Accordingly, if the set signals φSE and φSO are alternately set to high and low, the 1-bit control element that provides the enable signal φE of high level will shift to the right sequentially. If the comparison result from the phase comparator 3 indicates that a delay must be increased, the set signals φSE and φSO will alternately be set to high and low.

When the incremental (set) signals φSE and φSO and decremental (reset) signals φRE and φRO are kept low, a fixed 1-bit control element will provide an enable signal φE of high level. Accordingly, if the comparison result from the phase comparator 3 indicates to keep a delay, the signals φSE, φSO, φRE, and φRO are held low.

When carrying out a decremental operation, the reset signals φRE and φRO are alternately provided so that the 1-bit control element that provides the enable signal φE of high level may shift to the left sequentially.

In this way, the control section of FIG. 7 of the delay controller 21 (22) shifts the 1-bit control element that provides an enable signal φE of high level element by element, to control the 1-bit delay elements of FIG. 6C element by element.

Figure 9:
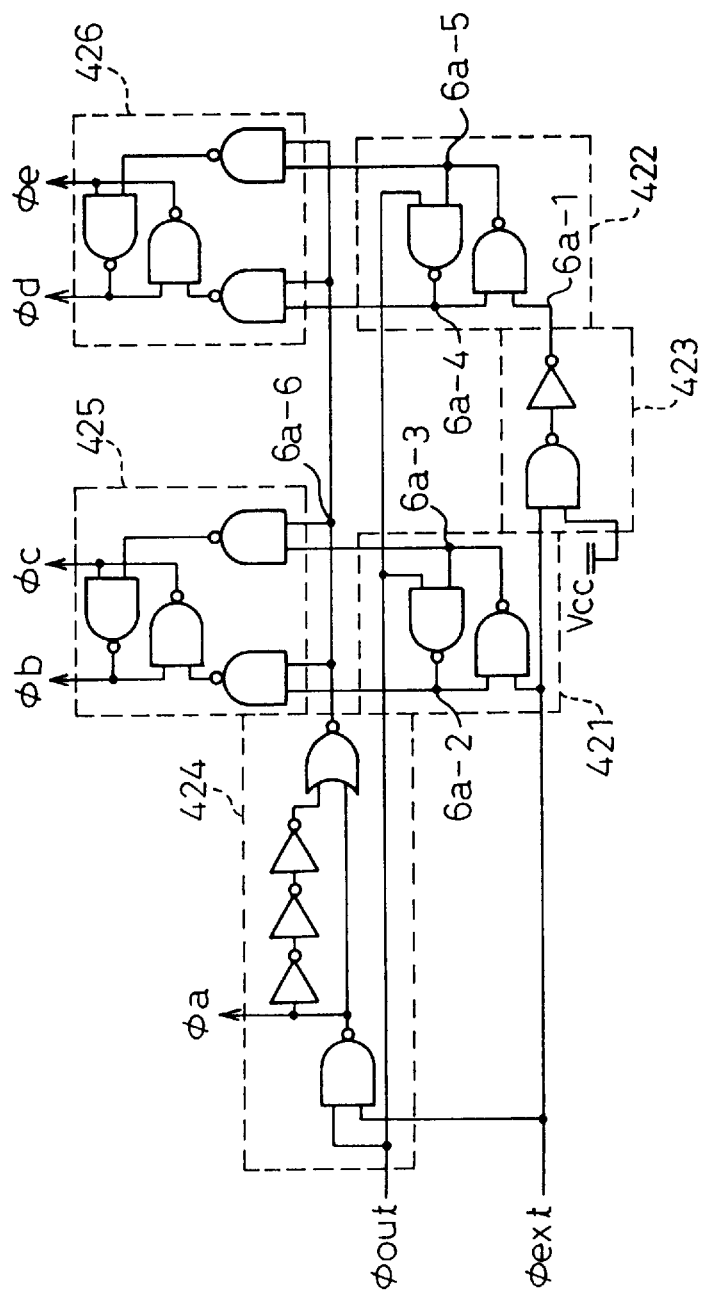
FIG. 9 shows a phase comparing section of a phase comparator according to the present invention.

FIG. 9 shows a phase comparing section of the phase comparator 3 according to the present invention, and FIGS. 10A to 10C are timing charts showing the operation of the phase comparing section.

Figure 11:
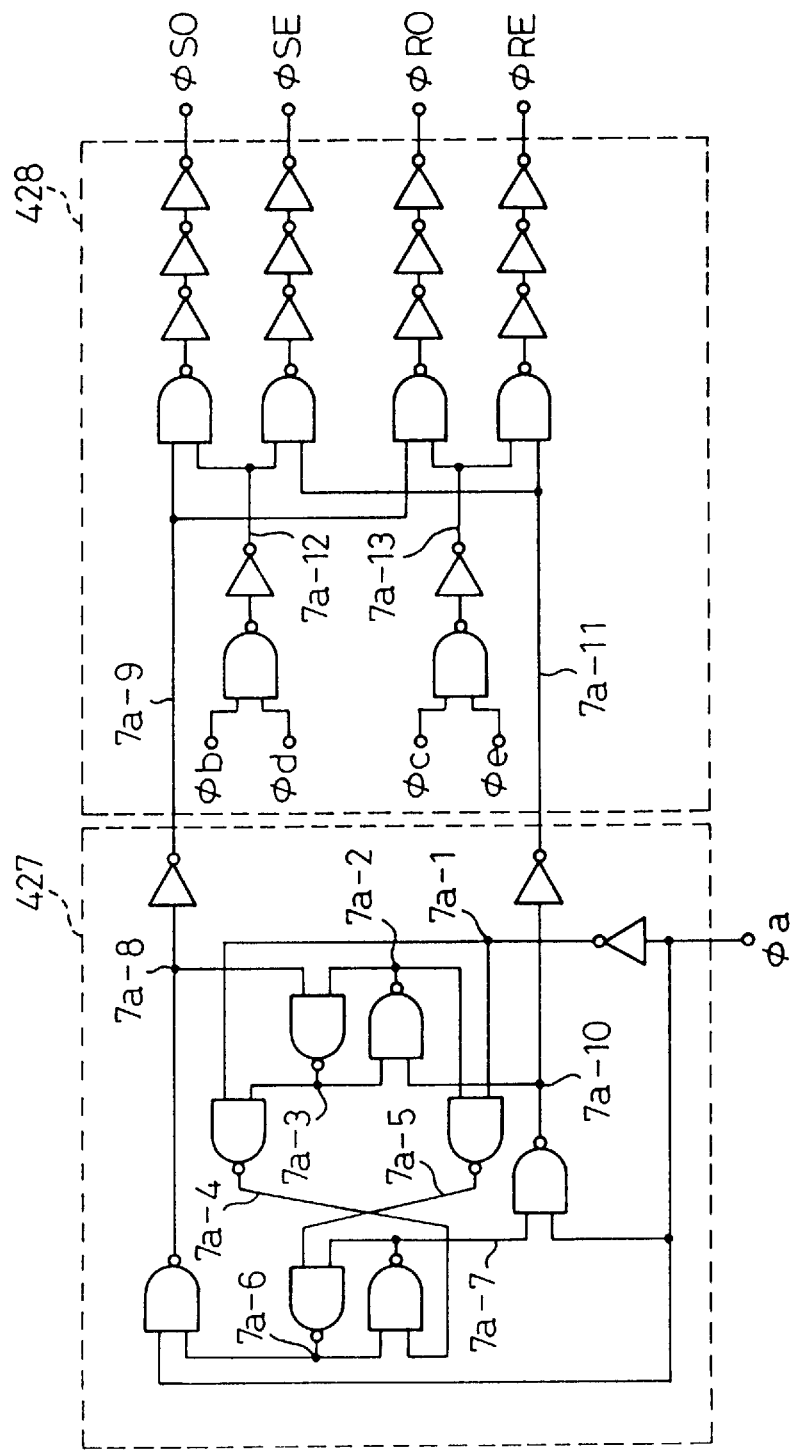
FIG. 11 shows an amplifying section of the phase comparator.

The phase comparator 3 consists of the phase comparing section of FIG. 9 and an amplifying section of FIG. 11.

In FIG. 9, the phase comparing section compares the dummy internal clock signal φout with the external clock signal φext serving as a reference signal. Output signals φa to φe are transferred to the amplifying section.

The phase comparing section is composed of flip-flops 421 and 422 each having two NAND gates, latches 425 and 426 for latching the states of the flip-flops 421 and 422, respectively, a generator 424 for generating an activation signal for the latches 425 and 426, and a 1-delay circuit 423 for obtaining a phase allowance for the external clock signal φext.

FIG. 10A shows that the phase of the dummy internal clock signal φout is ahead of the phase of the reference signal φext. Namely, the signal φout changes from low to high before the signal φext shows the same change. When the signals φout and φext are each at a low level, nodes 6a-2 to 6a-5 of the flip-flops 421 and 422 are each high. When the signal φout changes from low to high, the nodes 6a-2 and 6a-4 change from high to low. Thereafter, the signal φext changes from low to high, and after one unit delay, the node 6a-1 changes from low to high. In spite of these changes, the terminal voltages of the flip-flops 421 and 422 are unchanged because they are already fixed. As a result, the node 6a-2 is continuously low, 6a-3 high, 6a-4 low, and 6a-5 high.

When the signal φext changes from low to high, the output signal φa of the generator 424 changes from high to low, to apply a high pulse to the node 6a-6. Since the node 6a-6 is connected to the NAND gates of the latches 425 and 426, the NAND gates are temporarily activated, and the latches 425 and 426 latch the terminal voltages of the flip-flips 421 and 422. As a result, the output signal φb changes to high, φc to low, φd to high, and φe to low.

FIG. 10B shows that the dummy internal clock signal φout and reference signal φext have substantially the same phase and change from low to high substantially at the same time. Within a time difference between a rise of the signal φout and a rise of the node 6a-1, the signal φout changes from low to high. At this time, the signal φext changes from low to high, so that the node 6a-3 of the flip-flop 421 changes from high to low. In the flip-flop 422, the node 6a-1 maintains a low level, and the node 6a-4 changes from high to low. Thereafter, the node 6a-1 changes from low to high. At this time, the state of the flip-flop 422 is unchanged. The node 6a-6 provides a high pulse, and the latches 425 and 426 store the states. As a result, the output signal φb changes to low, φc to high, φd to high, and φe to low.

FIG. 10C shows that the phase of the dummy internal clock signal tout is behind the phase of the reference signal φext and that the signal φout changes from low to high after the same change in the signal φext. In this case, the signal φext causes changes in the flip-flops 421 and 422, and the nodes 6a-3 and 6a-5 change from high to low. As a result, the output signal φb changes to low, φc to high, φd to low, and φe to high.

In this way, a rise of the reference signal φext is used to determine whether a rise of the dummy internal clock signal φout is ahead, simultaneous, or behind. The determination is latched as values of the output signals φb, φc, φd, and φe. According to these values, it is determined to increment or decrement delays in the delay controllers 21 and 22.

Figure 12:
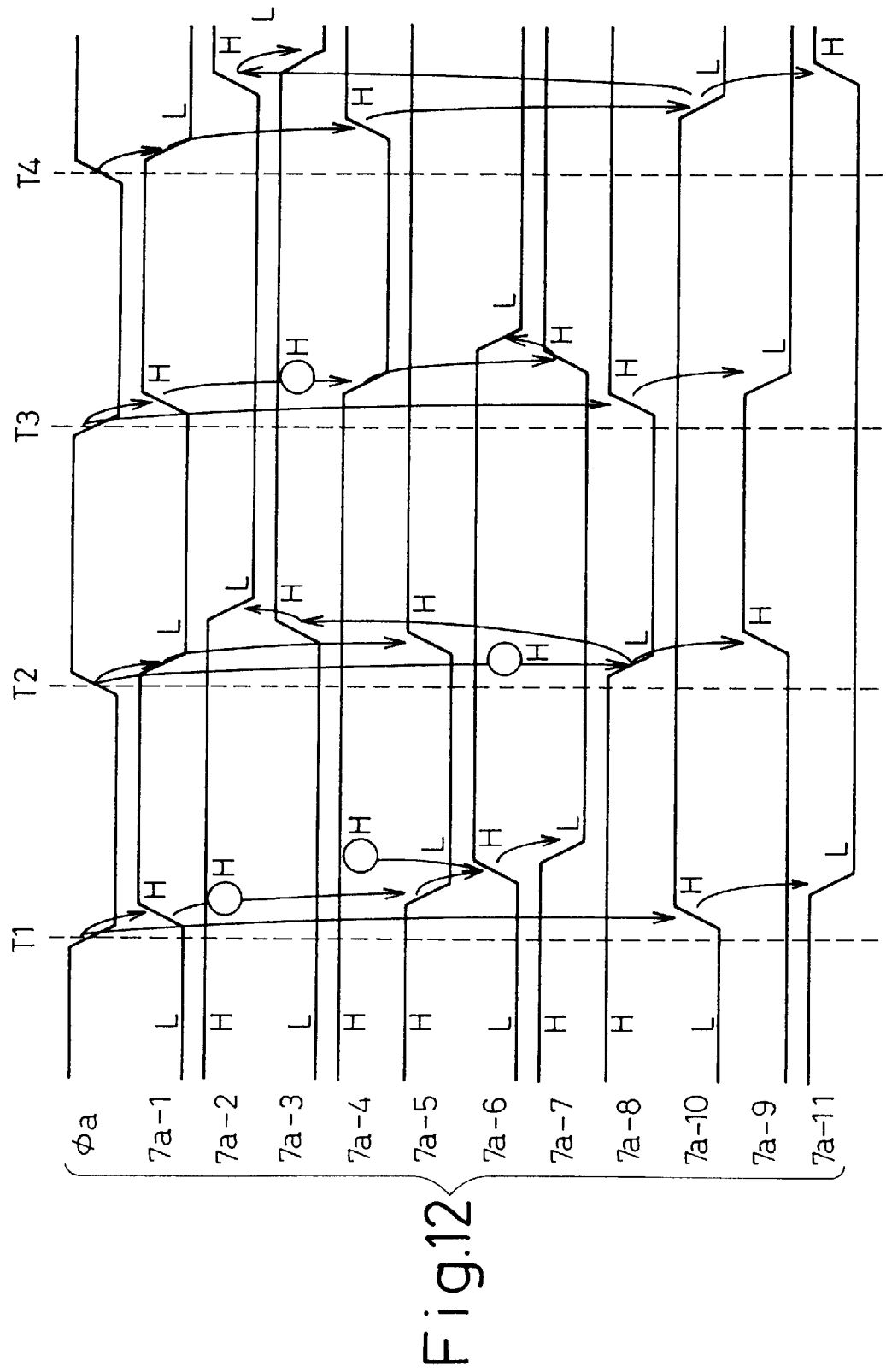
FIG. 12 is a timing chart showing the operation of a JK flip-flop of the amplifying section of FIG. 11.

FIG. 11 shows the amplifying section of the phase comparator 3 of the present invention, and FIG. 12 is a timing chart showing the operation of a JK flip-flop of the amplifying section.

The amplifying section has the JK flip-flop 427 and an amplifier 428 consisting of NAND gates and inverters. The JK flip-flop 427 receives the output signal φa from the phase comparing section of FIG. 9. In response to the level of the signal φa, the voltages of nodes 7a-9 and 7a-11 alternate between high and low levels. The amplifier 428 receives and amplifies the outputs of the JK flip-flip 427 and the signals φb to φe.

The operation of the JK flip-flop 427 will be explained with reference to the timing chart of FIG. 12. The signal φa changes from high to low at time T1, and then, nodes 7a-1 and 7a-10 change from low to high. Nodes 7a-5, 7a-6, and 7a-7 change in response to the change at the node 7a-1, but a node 7a-8 shows no change because the signal φa is low. As a result, the output node 7a-9 is unchanged, and the output node 7a-11 changes from high to low. At time T2, the signal φa changes from low to high, and then, the node 7a-8 changes from high to low. The node 7a-10 is unchanged because the node 7a-7 is unchanged. The output node 7a-9 changes from low to high, and the output node 7a-11 is unchanged. In this way, the output nodes 7a-9 and 7a-11 of the JK flip-flop 427 alternately change from high to low and from low to high.

Figure 13:
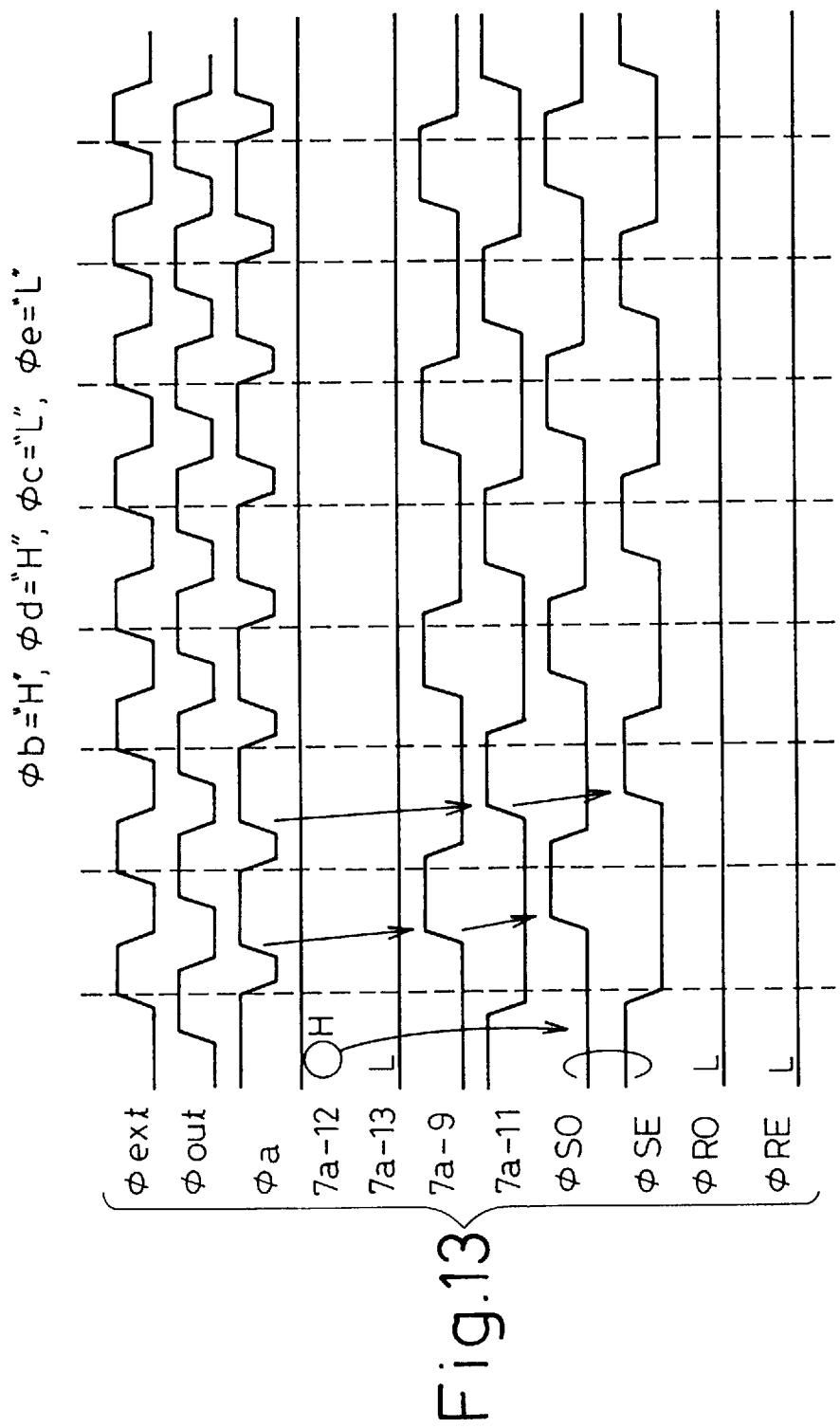
FIG. 13 is a timing chart showing an incremental operation of the amplifying section of FIG. 11.
Figure 14:
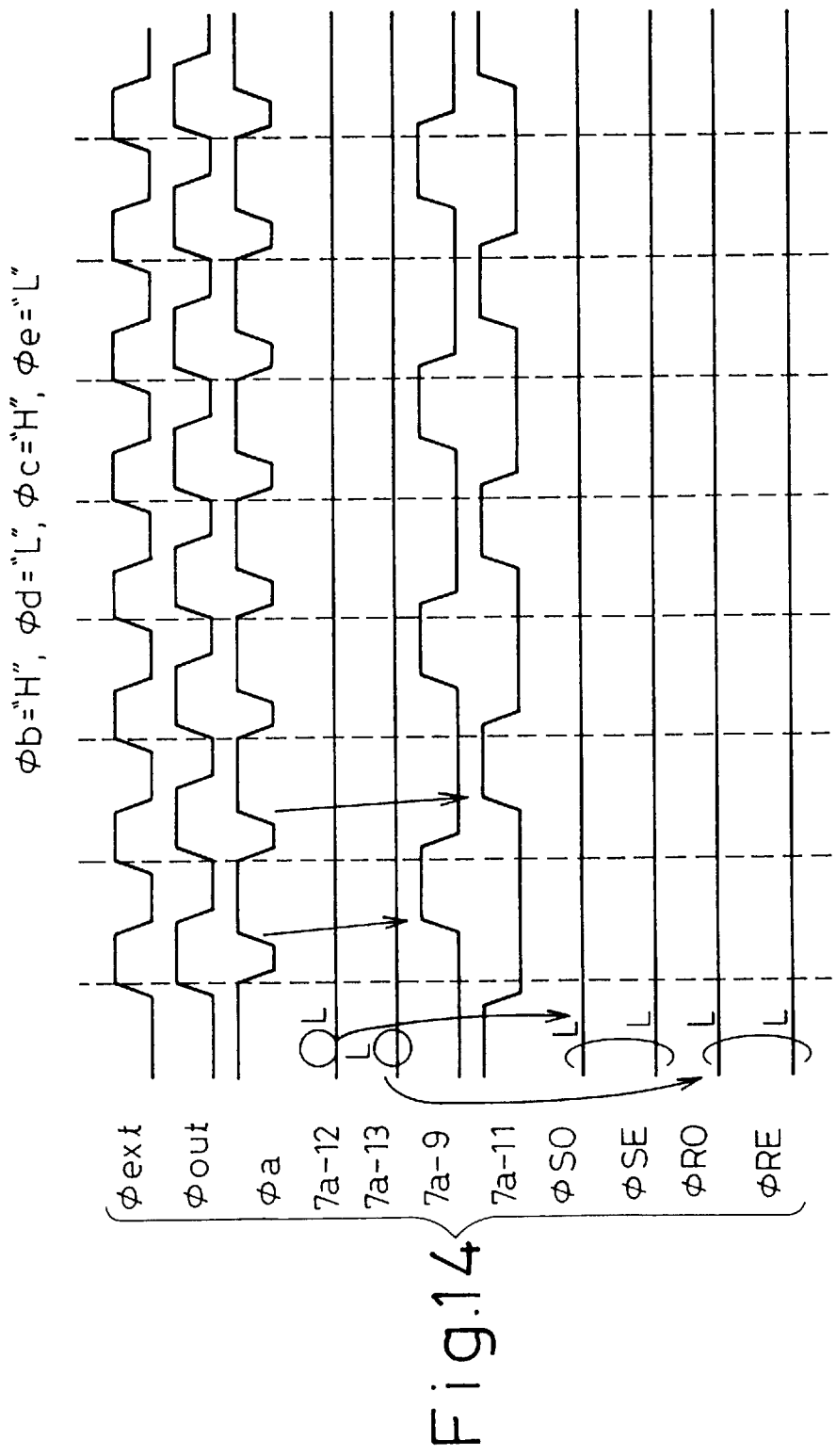
FIG. 14 is a timing chart showing a sustain operation of the amplifying section of FIG. 11.
Figure 15:
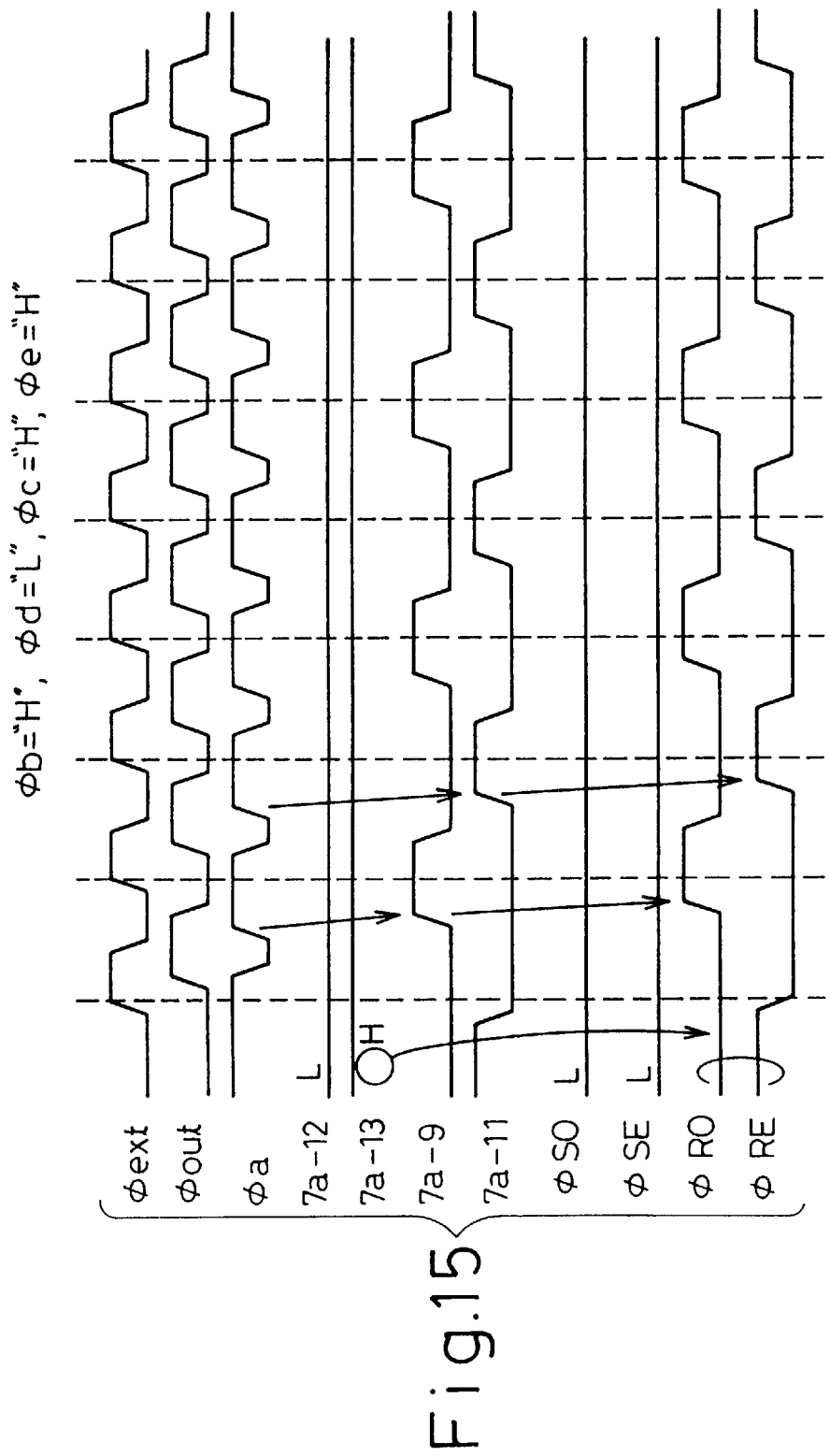
FIG. 15 is a timing chart showing a decremental operation of the amplifying section of FIG. 11.

FIG. 13 is a timing chart showing an incremental operation of the amplifying section 428 of FIG. 11 of the phase comparator 3, FIG. 14 is a timing chart showing a sustain operation of the same, and FIG. 15 is a timing chart showing a decremental operation of the same.

In FIG. 13, the dummy internal clock signal φout changes from low to high before the same change in the reference signal φext. In this case, the phase comparing section of FIG. 9 provides the signal φb of high, φc of low, φd of high, and φe of low. As a result, a node 7a-12 becomes high, and a node 7a-13 is fixed at low. Although the incremental (set)

signals φSO and φSE change in response to the state of the JK flip-flop 427, the decremental (reset) signals φRO and φRE are unchanged because the node 7a-13 is low.

In FIG. 14, the signal φout changes from low to high substantially simultaneously with the reference signal φext. In this case, the phase comparing section of FIG. 9 provides the signal φb of low, φc of high, φd of high, and φe of low. As a result, the nodes 7a-12 and 71-13 are fixed at low. The set signals φSO and φSE are not influenced by the output of the JK flip-flop, and therefore, the signals φSO, φSE, φRO, and φRE are fixed at low.

In FIG. 15, the signal φout changes from low to high behind the same change in the reference signal φext. In this case, the phase comparing section of FIG. 9 provides the signal φb of low, φc of high, φd of low, and φe of high. As a result, the node 7a-12 is fixed at low, the node 7a-13 is fixed at high, the reset signals φRO and φRE change in response to the state of the JK flip-flop, and the set signals φSO and φSE are unchanged because the node 7a-12 is low.

Figure 16:
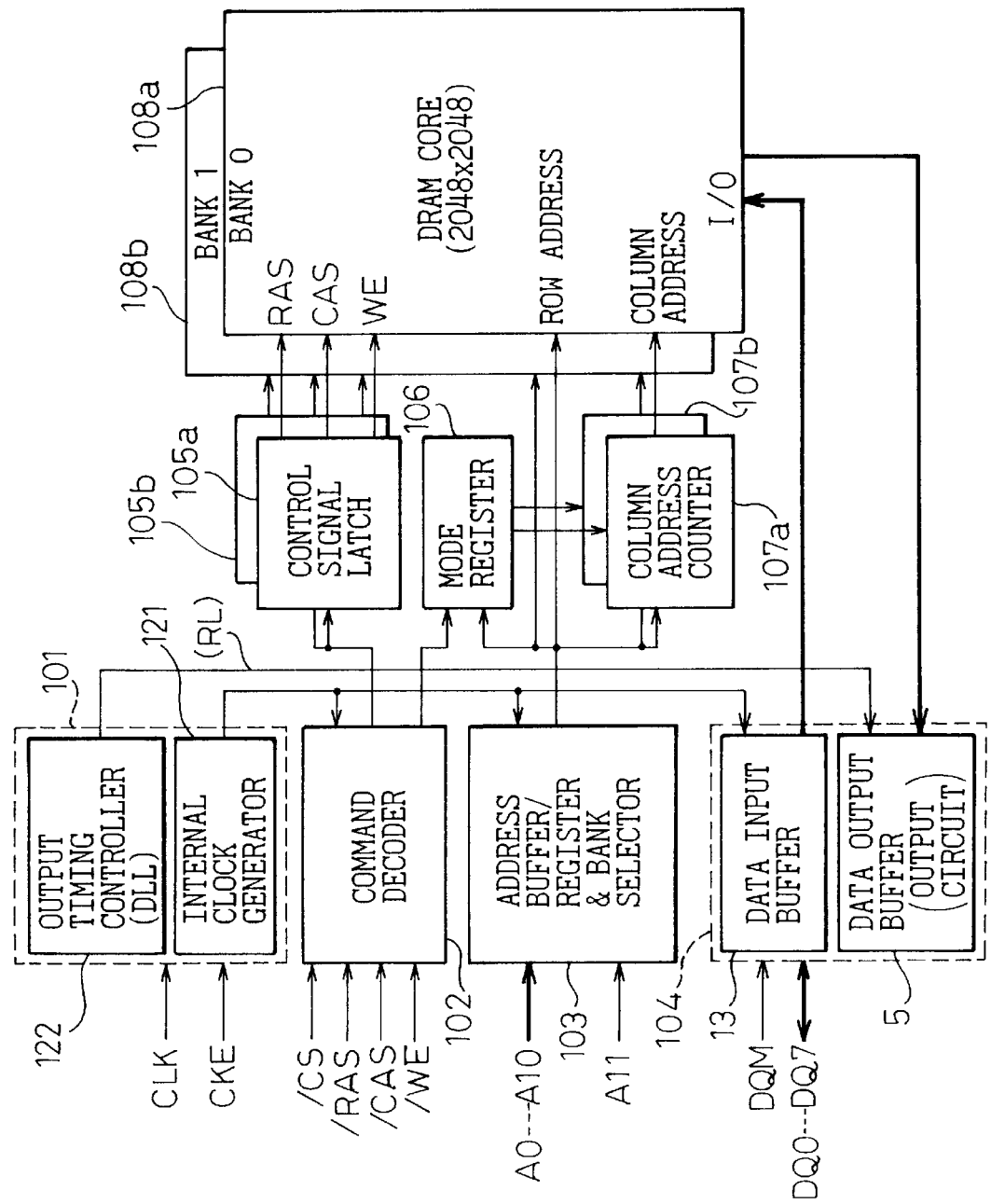
FIG. 16 shows an SDRAM according to the present invention.
Figure 17:
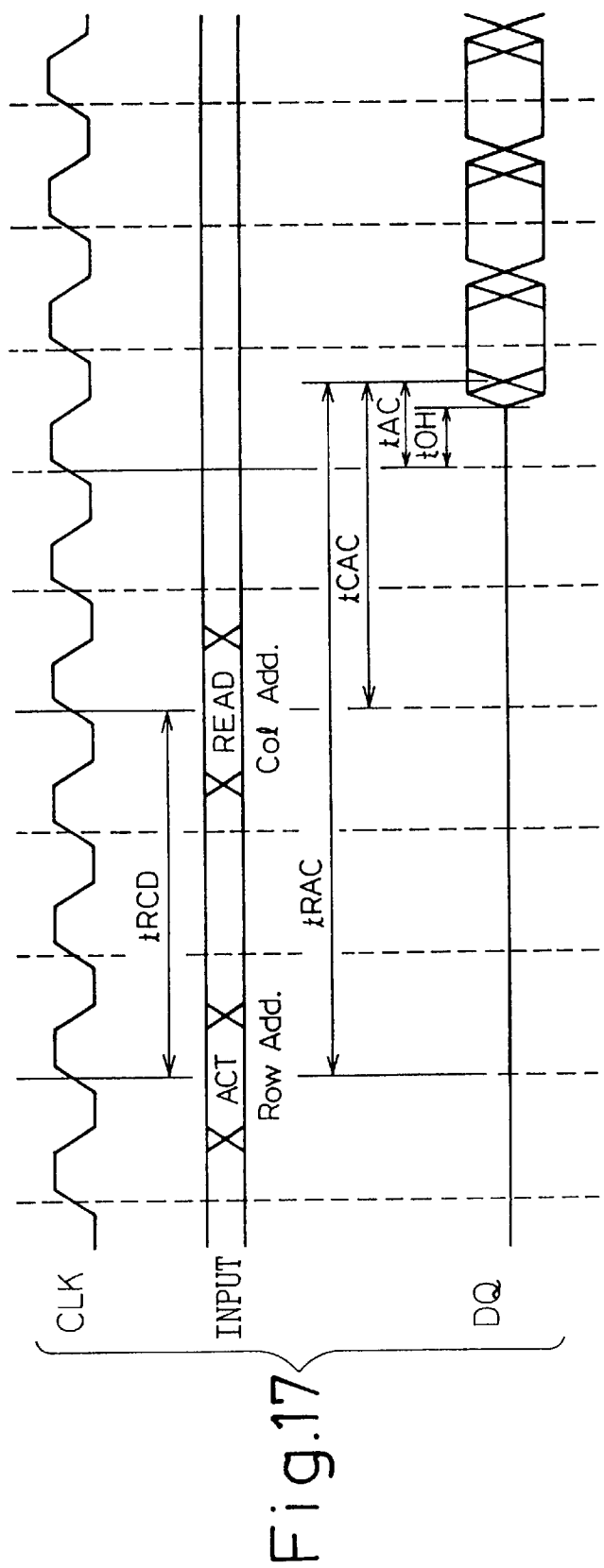
FIG. 17 is a timing chart showing the operation of the SDRAM of FIG. 16.

FIG. 16 shows an SDRAM employing the DLL circuit of the present invention, and FIG. 17 is a timing chart showing the operation of the SDRAM.

The SDRAM employs a pipeline method and is a 2-bank, 8-bit, 16-M SDRAM.

The SDRAM has DRAM cores 108a and 108b, a clock buffer 101, a command decoder 102, an address buffer/register and bank address selector 103, an I/O data buffer/register 104, control signal latches 105a and 105b, a mode register 106, and column address counters 107a and 107b. Signals /CS, /RAS, /CAS, and /WE are combined to form a command that specifies an operation mode. The command is decoded by the command decoder 102, and according to a mode specified by the command, circuits are controlled. The signals /CS, /RAS, /CAS, and /WE are also supplied to the latches 105a and 105b that maintain their states until the next command is provided.

Address signals are amplified by the address buffer 103, which provides row addresses for the banks as well as initial addresses for the column address counters 107a and 107b.

The clock buffer 101 has an internal clock generator 121 and an output timing controller 122, which is the DLL circuit of the present invention. The internal clock generator 121 generates an ordinary internal clock signal according to an external clock signal CLK. The output timing controller 122 generates a delay-locked (phase-locked) clock signal after carrying out the delay control of the present invention mentioned above.

The register 104 has a data input buffer 13 and a data output circuit 5 including output circuits 50 to 57. The data output circuit 5 amplifies data read out of the DRAM cores 108a and 108b and provides the data through output pads DQ0 to DQ7 according to the delay-locked clock signal provided by the output timing controller 122. Input data to the pads DQ0 to DQ7 are received by the data input buffer 13. A real line to which the present invention is applied runs between the output timing controller 122 and the data output circuit 5.

FIG. 17 shows a read operation of the SDRAM of FIG. 16.

The external clock signal CLK is supplied from a system to the SDRAM. In synchronization with a rise of the clock signal CLK, the SDRAM reads commands, address signals, and input data and provides output data.

When reading data out of the SDRAM, the command signals /CS, /RAS, /CAS, and /WE are combined to form an active command (ACT), which is supplied to a command terminal. At the same time, a row address signal is supplied to an address terminal. Then, the SDRAM is activated to select a word line corresponding to the row address, provides corresponding cell data to a corresponding bit line, and amplifies the data by a sense amplifier.

After an operation time tRCD related to the row address, a read command and a column address are supplied to the SDRAM. The SDRAM selects sense amplifier data according to the column address, supplies the data to a data bus line, amplifies the data by a data bus amplifier, further amplifies the data by the output buffer, and transfers the data to the output terminal DQ. These operations are the same as those of a standard DRAM. In the SDRAM, circuits related to a column address carry out a pipeline operation, and read data is continuously provided. Accordingly, a data transfer speed is determined by the period of the external clock signal.

The SDRAM involves three kinds of access time each of which is defined according to a rise of the clock signal CLK. In FIG. 17, there are row address access time tRAC, column address access time tCAC, and clock signal access time tAC. When the SDRAM is used in a high-speed memory system, tRAC and tCAC are important because they determine a period between command input and first data output. As explained with reference to FIG. 3, the clock signal access time tAC is also important.

Figure 18:
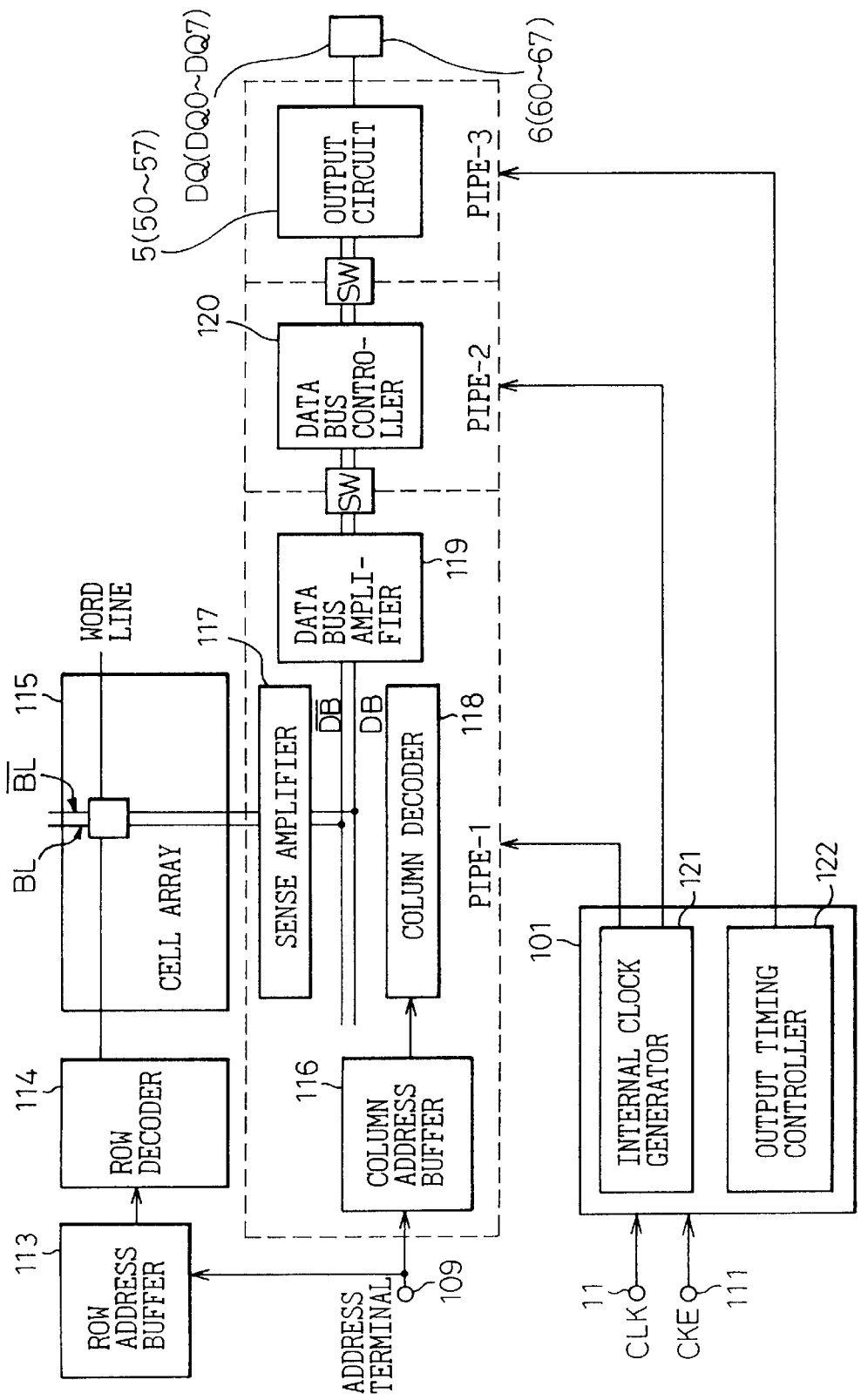
FIG. 18 is a block diagram showing essential parts of the SDRAM of FIG. 16.

FIG. 18 is a block diagram showing essential parts of the SDRAM of FIG. 16 and explains a pipeline operation thereof with, for example, three pipes.

The circuit for processing a column address in the SDRAM is divided into several sections along a processing flow. Each of the divided sections is called a pipe.

As explained with reference to FIG. 16, the buffer 101 has the internal clock generator 121 and output timing controller 122. The internal clock generator 121 generates an ordinary internal clock signal, which is supplied to the pipes 1 and 2. The output timing controller 122 provides a delay-locked (phase-locked) internal clock signal to the output circuit 5 (data output circuits 50 to 57) of the pipe 3.

The supplied internal clock signals control the corresponding pipes. Between the pipes, there is a switch for controlling the transmission timing of a signal between the pipes. These switches are controlled according to the internal clock signal generated by the generator 121.

In the pipe 1, a column address buffer 116 amplifies an address signal and sends it to a column decoder 118. The column decoder 118 selects an address. Data at the address is amplified by a sense amplifier 117 and then is supplied to a data bus. The data on the data bus is amplified by a data bus amplifier 119. The pipe 2 involves only a data bus controller 120. The pipe 3 involves the I/O buffer 104 (output circuit 5). The data input buffer 13 in the I/O buffer 104 is not shown in FIG. 18.

The circuit(s) in each pipe completes its operation within a clock cycle, and the switch between the pipes is opened and closed in synchronization with the clock signal, to relay data. As a result, the pipes process data in parallel, and data is continuously sent to the output terminal in synchronization with the clock signal.

Figure 19:
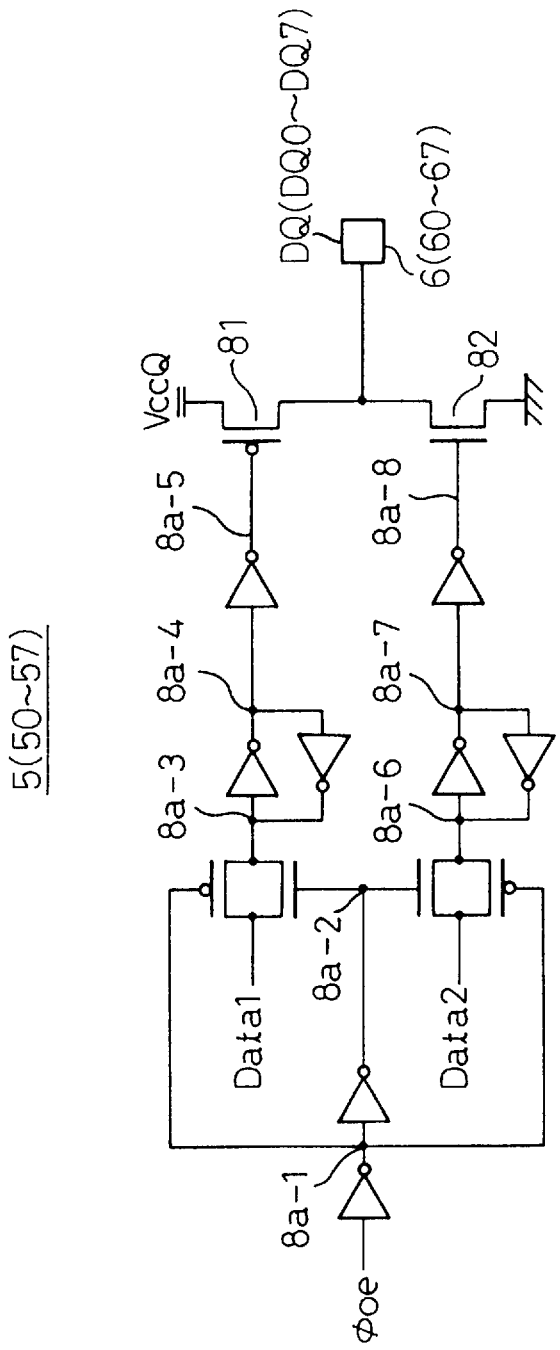
FIG. 19 shows a data output buffer of the circuit of FIG. 18.

FIG. 19 shows an example of the output circuit 5 (output circuits 50 to 57) of FIG. 18. Signals Data1 and Data2 correspond to data read out of a cell array 115 through the sense amplifier 117, data bus amplifier 119, and data bus controller 120 of FIG. 18. The signals Data1 and Data2 are each low when the read data is high and are each high when the read data is low. If the read data is not high nor low under a high-impedance (high-Z) state, the data bus controller 120 sets the signal Data1 to high and the signal Data2 to low. A signal φoe corresponds to the internal clock signal from the output timing controller 122 (the first delay controller 21) and serves as an enable signal for the output circuit 5 (output circuits 50 to 57).

When the clock signal φoe becomes high, the signals Data1 and Data2 appear at the data output pad 6 (output pads 60 to 67). When letting the output pad 6 provide a signal of high level, the signal φoe changes from low to high, a node 8a-1 to low, and a node 8a-2 to high, to turn on transfer gates. Then, the signals Data1 and Data2 are transferred to nodes 8a-3 and 8a-6. As a result, a node 8a-5 changes to low and a node 8a-8 to high, to turn on a p-channel transistor 81 and off an n-channel transistor 82. Consequently, the data output pad 6 provides a signal of high level. When the signal φoe changes to low, the transfer gates are turned off to hold the current output state.

The present invention is applicable not only to SDRAMs but also to any semiconductor integrated circuits that provide an output signal in synchronization with an external clock signal.

Figure 20:
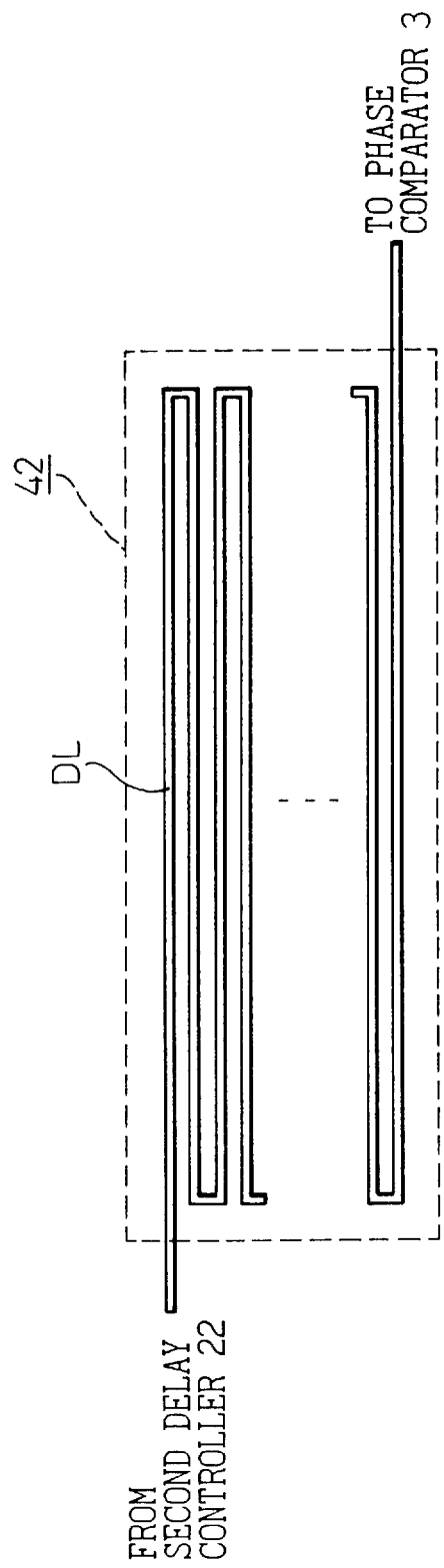
FIG. 20 shows a dummy line for transmitting a dummy internal clock signal in a semiconductor integrated circuit according to the present invention.

FIG. 20 shows an example of the dummy line 42 according to the present invention. The dummy line 42 is formed on a chip and has the same width as the real line 41. A dummy line 242 (FIG. 21) formed in a semiconductor integrated circuit module to be explained below and a dummy line 342 (FIG. 22) formed in a semiconductor integrated circuit system to be explained below are fabricated on a module or on a circuit board. Any dummy line may be replaced with a combination of capacitors or resistors.

Figure 21:
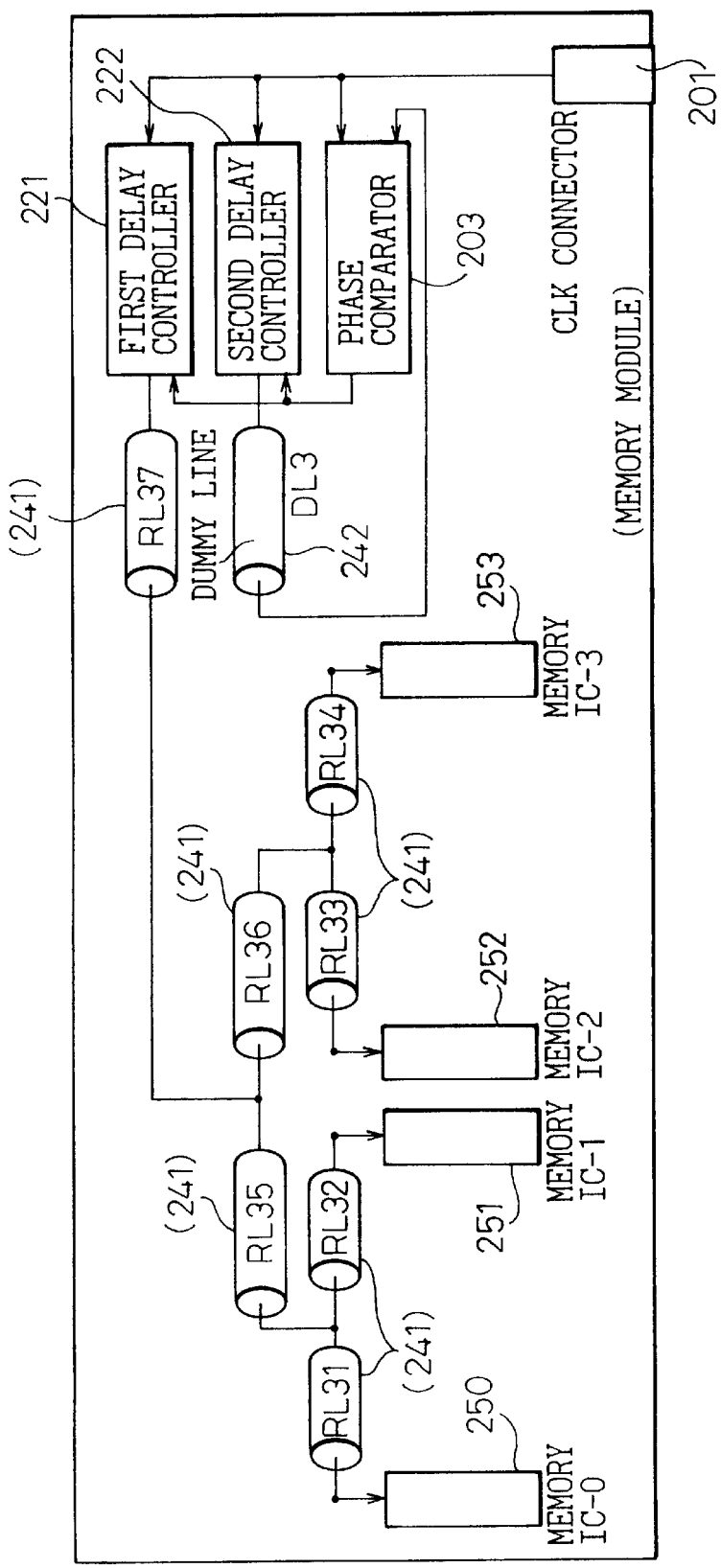
FIG. 21 shows a memory module according to the present invention.

FIG. 21 shows a memory module such as a single inline memory module (SIMM) and a dual inline memory module (DIMM) employing the DLL circuit of the present invention. The module has a clock signal connector 201, memory ICs (object circuits) 250 to 253, a first delay controller 221, a second delay controller 222, a phase comparator 203, a real line 241 for transmitting an internal clock signal, and the dummy line 242 for transmitting a dummy internal clock signal.

An external clock signal CLK is passed through the clock signal connector 201 and is supplied to the delay controllers 221 and 222 and phase comparator 203. The delay controller 221 provides the internal clock signal to the memory ICs 250 to 253 through the real line 241, similar to the circuit of FIG. 5. The delay controller 222 provides the dummy internal clock signal to the phase comparator 203 through the dummy line 242. The phase comparator 203 compares the phases of the provided two signals, and according to the comparison result, controls delays in the delay controllers 221 and 222. The details of the DLL circuit are the same as those explained above.

The memory ICs 250 to 253 correspond to the output circuits 50 to 57 or the output pads 60 to 67 of the circuit of FIG. 5.

The length of the real line 241 from the delay controller 221 to any one of the memory ICs 250 to 253 is identical. Namely, the lengths RL35 and RL36 of the real line 241 are equal to each other, and the lengths RL31, RL32, RL33, and RL34 thereof are equal to one another. Consequently, RL37+RL35+RL31=RL37+RL35+RL32=RL37+RL36+RL33=RL37+RL36+RL34. The length DL3 of the dummy line 242 is equalized to RL37+RL35+RL31, to synchronize the operation timing of all the memory ICs 250 to 253.

FIG. 22 shows a memory system employing the DLL circuit of the present invention. The system has a clock signal generator 300, memory modules (object circuits) 350 to 353, a first delay controller 321, a second delay controller 322, a phase comparator 303, a real line 341 for transmitting an internal clock signal, and a dummy line 342 for transmitting a dummy internal clock signal.

The clock signal generator 300 generates a clock signal CLK, which is supplied to the delay controllers 321 and 322 and phase comparator 303. The first delay controller 321 provides the internal clock signal to the memory modules 350 to 353 through the real line 341, similar to the memory module of FIG. 21. The second delay controller 322 provides the dummy internal clock signal to the phase comparator 303 through the dummy line 342. The phase comparator 303 compares the phases of the received two signals, and according to the comparison result, controls delays in the delay controllers 321 and 322. The details of the DLL circuit are as explained above.

The memory modules 350 to 353 correspond to the memory ICs 250 to 253 of the memory module of FIG. 21.

The length of the real line 341 from the first delay controller 321 to any one of the memory modules 350 to 353 is identical. Namely, RL45=RL46, and RL41=RL42=RL43=RL44. The length of the real line 341 from the first delay controller 321 to a node between the lengths RL45 and RL46 is RL47. Accordingly, RL47+RL45+RL41=RL47+RL45+RL42=RL47+RL46+RL43=RL47+RL46+RL44. The length DL4 of the dummy line 342 is equalized to RL47+RL45+RL41, to synchronize the operation timing of all the memory modules 350 to 353.

Although the examples of FIGS. 21 and 22 are based on the circuit of FIG. 5, the circuit of FIG. 4 of the present invention is also applicable to memory modules and memory systems.

The present invention is applicable not only to memories such as SDRAMs, memory modules, and memory systems but also to other semiconductor integrated circuits, semiconductor integrated circuit modules, and semiconductor integrated circuit systems. The present invention may control not only a clock signal but also other signals.

As explained above in detail, the present invention provides a semiconductor integrated circuit that provides a phase-locked control signal to object circuits or pads without regard to the physical locations thereof. The present invention is capable of providing a phase-locked control signal in a semiconductor integrated circuit module and a semiconductor integrated circuit system.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit having:
   first and second delay controllers for receiving an input signal;
   a plurality of object circuits for receiving an internal signal output from said first delay circuit through a real line; and
   a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
   a length of said real line from said first delay controller to any one of said object circuits is substantially identical; and
   a load value of said dummy line is substantially equal to that of said real line between said first delay controller and a specific one of said object circuits.

2. A semiconductor integrated circuit as claimed in claim 1, wherein a length of said dummy line is substantially equal to the length of said real line between said first delay controller and the specific one of said object circuits.

3. A semiconductor integrated circuit as claimed in claim 1, wherein said real line has a tree shape between said first delay controller and said object circuits so as to determine the length of said real line to any one of said object circuits to be identical.

4. A semiconductor integrated circuit as claimed in claim 1, wherein the input signal is a clock signal for supply to said object circuits.

5. A semiconductor integrated circuit as claimed in claim 1, wherein said semiconductor integrated circuit is a synchronous DRAM, and said object circuits are data output buffer circuits of said synchronous DRAM.

6. A semiconductor-integrated circuit as claimed in claim 5, wherein the input signal is an enable signal for each of said data output buffer circuits.

7. A semiconductor integrated circuit having:
   first and second delay controllers for receiving an input signal;
   a plurality of object circuits for receiving an internal signal output from said first delay circuit through a real line; and
   a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
      said real line from said first delay controller to said object circuits has a symmetrical tree shape; and
      a load value of said dummy line is substantially equal to that of said real line between said first delay controller and any one of said object circuits.

8. A semiconductor integrated circuit as claimed in claim 7, wherein a length of said dummy line is substantially equal to a length of said real line between said first delay controller and any one of said object circuits.

9. A semiconductor integrated circuit as claimed in claim 7, wherein the input signal is a clock signal for supply to said object circuits.

10. A semiconductor integrated circuit as claimed in claim 7, wherein said semiconductor integrated circuit is a synchronous DRAM, and said object circuits are data output buffer circuits of said synchronous DRAM.

11. A semiconductor integrated circuit as claimed in claim 10, wherein the input signal is an enable signal for each of said data output buffer circuits.

12. A semiconductor integrated circuit having:
   first and second delay controllers for receiving an input signal;
   a plurality of object circuits for receiving an internal signal output from said first delay circuit through a real line; and
   a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
      said object circuits are arranged in groups each having a node for receiving the internal signal output from said first delay controller, said real line from said first delay controller to the nodes is laid out in a symmetrical tree shape, and a load value of said dummy line is substantially equal to that of said real line between said first delay controller and a specific one of the nodes.

13. A semiconductor integrated circuit as claimed in claim 12, wherein a length of said dummy line is substantially equal to a length of said real line between said first delay controller and the specific one of said object circuits.

14. A semiconductor integrated circuit as claimed in claim 12, wherein the input signal is a clock signal for supply to said object circuits.

15. A semiconductor integrated circuit as claimed in claim 12, wherein said semiconductor integrated circuit is a synchronous DRAM, and said object circuits are data output buffer circuits of said synchronous DRAM.

16. A semiconductor integrated circuit as claimed in claim 15, wherein the input signal is an enable signal for each of said data output buffer circuits.

17. A semiconductor integrated circuit module having:
   first and second delay controllers for receiving an input signal;
   a plurality of object semiconductor integrated circuits for receiving an internal signal output from said first delay circuit through a real line; and
   a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
      a length of said real line from said first delay controller to any one of said object semiconductor integrated circuits is substantially identical; and
      a load value of said dummy line is substantially equal to that of said real line between said first delay controller and a specific one of said object semiconductor integrated circuits.

18. A semiconductor integrated circuit module as claimed in claim 17, wherein a length of said dummy line is substantially equal to the length of said real line between said first delay controller and the specific one of said object semiconductor integrated circuits.

19. A semiconductor integrated circuit module as claimed in claim 17, wherein said real line has a tree shape between said first delay controller and said object semiconductor integrated circuits so as to determine the length of said real line to any one of said object semiconductor integrated circuits to be identical.

20. A semiconductor integrated circuit module as claimed in claim 17, wherein said semiconductor integrated circuit module is a memory module, and each of said object semiconductor integrated circuits is a memory chip of said memory module.

21. A semiconductor integrated circuit module as claimed in claim 17, wherein the input signal is a clock signal, and an input terminal of each of said object semiconductor integrated circuits is a clock input terminal.

22. A semiconductor integrated circuit module having:
first and second delay controllers for receiving an input signal;
a plurality of object semiconductor integrated circuits for receiving an internal signal output from said first delay circuit through a real line; and
a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
said real line from said first delay controller to said object semiconductor integrated circuits has a symmetrical tree shape; and
a load value of said dummy line is substantially equal to that of said real line between said first delay controller and any one of said object semiconductor integrated circuits.

23. A semiconductor integrated circuit module as claimed in claim 22, wherein a length of said dummy line is substantially equal to a length of said real line between said first delay controller and any one of said object semiconductor integrated circuits.

24. A semiconductor integrated circuit module as claimed in claim 22, wherein said semiconductor integrated circuit module is a memory module, and each of said object semiconductor integrated circuits is a memory chip of said memory module.

25. A semiconductor integrated circuit module as claimed in claim 22, wherein the input signal is a clock signal, and an input terminal of each of said object semiconductor integrated circuits is a clock input terminal.

26. A semiconductor integrated circuit module having:
first and second delay controllers for receiving an input signal;
a plurality of object semiconductor integrated circuits for receiving an internal signal output from said first delay circuit through a real line; and
a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
said object semiconductor integrated circuits are arranged in groups each having a node for receiving the internal signal output from said first delay controller, said real line from said first delay controller to the nodes is laid out in a symmetrical tree shape, and a load value of said dummy line is substantially equal to that of said real line between said first delay controller and a specific one of the nodes.

27. A semiconductor integrated circuit module as claimed in claim 26, wherein a length of said dummy line is substantially equal to a length of said real line between said first delay controller and the specific one of said object semiconductor integrated circuits.

28. A semiconductor integrated circuit module as claimed in claim 26, wherein said semiconductor integrated circuit module is a memory module, and each of said object semiconductor integrated circuits is a memory chip of said memory module.

29. A semiconductor integrated circuit module as claimed in claim 26, wherein the input signal is a clock signal, and an input terminal of each of said object semiconductor integrated circuits is a clock input terminal.

30. A semiconductor integrated circuit system having:
first and second delay controllers for receiving an input signal;
a plurality of object semiconductor integrated circuit modules for receiving an internal signal output from said first delay circuit through a real line; and
a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
a length of said real line from said first delay controller to any one of said object semiconductor integrated circuit modules is substantially identical; and
a load value of said dummy line is substantially equal to that of said real line between said first delay controller and a specific one of said object semiconductor integrated circuit modules.

31. A semiconductor integrated circuit system as claimed in claim 30, wherein a length of said dummy line is substantially equal to the length of said real line between said first delay controller and the specific one of said object semiconductor integrated circuit modules.

32. A semiconductor integrated circuit system as claimed in claim 30, wherein said real line has a tree shape between said first delay controller and said object semiconductor integrated circuit modules so as to determine the length of said real line to any one of said object semiconductor integrated circuit modules to be identical.

33. A semiconductor integrated circuit system as claimed in claim 30, wherein each of said object semiconductor integrated circuit modules is a memory module, and an input terminal of each of said object semiconductor integrated circuit modules is a clock input terminal.

34. A semiconductor integrated circuit system having:
first and second delay controllers for receiving an input signal;
a plurality of object semiconductor integrated circuit modules for receiving an internal signal output from said first delay circuit through a real line; and
a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
said real line from said first delay controller to said object semiconductor integrated circuit modules has a symmetrical tree shape; and
a load value of said dummy line is substantially equal to that of said real line between said first delay controller and any one of said object semiconductor integrated circuit modules.

35. A semiconductor integrated circuit system as claimed in claim 34, wherein a length of said dummy line is substantially equal to a length of said real line between said first delay controller and any one of said object semiconductor integrated circuit modules.

36. A semiconductor integrated circuit system as claimed in claim 34, wherein each of said object semiconductor integrated circuit modules is a memory module, and an input terminal of each of said object semiconductor integrated circuit modules is a clock input terminal.

37. A semiconductor integrated circuit system having:
- first and second delay controllers for receiving an input signal;
- a plurality of object semiconductor integrated circuit modules for receiving an internal signal output from said first delay circuit through a real line; and
- a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
  - said object semiconductor integrated circuit modules are arranged in groups each having a node for receiving the internal signal output from said first delay controller, said real line from said first delay controller to the nodes is laid out in a symmetrical tree shape, and a load value of said dummy line is substantially equal to that of said real line between said first delay controller and a specific one of the nodes.

38. A semiconductor integrated circuit system as claimed in claim 37, wherein a length of said dummy line is substantially equal to a length of said real line between said first delay controller and the specific one of said object semiconductor integrated circuit modules.

39. A semiconductor integrated circuit system as claimed in claim 37, wherein each of said object semiconductor integrated circuit modules is a memory module, and an input terminal of each of said object semiconductor integrated circuit modules is a clock input terminal.

40. A semiconductor integrated circuit having:
- first and second delay controllers for receiving an input signal;
- a plurality of object circuits for receiving an internal signal output from said first delay circuit through a real line; and
- a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
  - a load value of said dummy line is substantially equal to that of an average length of said real lines from said first delay controller to said plurality of object circuits.

41. A semiconductor integrated circuit module having:
- first and second delay controllers for receiving an input signal;
- a plurality of object semiconductor integrated circuits for receiving an internal signal output from said first delay circuit through a real line; and
- a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
  - a load value of said dummy line is substantially equal to that of an average length of said real lines from said first delay controller to said plurality of object semiconductor integrated circuits.

42. A semiconductor integrated circuit system having:
- first and second delay controllers for receiving an input signal;
- a plurality of object semiconductor integrated circuit modules for receiving an internal signal output from said first delay circuit through a real line; and
- a phase comparator for receiving the input signal and a dummy internal signal output from said second delay controller through a dummy line, for comparing phases of the received input and dummy internal signals with each other, and for controlling delays in said first and second delay controllers in accordance with the comparison result, wherein:
  - a load value of said dummy line is substantially equal to that of an average length of said real lines from said first delay controller to said plurality of object semiconductor integrated circuit modules.

* * * * *